(12) United States Patent
Little et al.

(10) Patent No.: US 9,490,595 B2
(45) Date of Patent: Nov. 8, 2016

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Chih-Pi Cheng, New Taipei (TW); Wei-Hao Su, New Taipei (TW); Shuo-Hsiu Hsu, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 14/640,994

(22) Filed: Mar. 6, 2015

(65) Prior Publication Data

US 2015/0194768 A1 Jul. 9, 2015

Related U.S. Application Data

(63) Continuation-in-part of application No. 14/591,927, filed on Jan. 8, 2015, and a continuation-in-part of application No. 14/497,205, filed on Sep. 25, 2014, and a continuation-in-part of application No.

(Continued)

(51) Int. Cl.
*H01R 13/6594* (2011.01)
*H01R 24/60* (2011.01)

(Continued)

(52) U.S. Cl.
CPC .......... *H01R 24/60* (2013.01); *H01R 13/6594* (2013.01); *H01R 2107/00* (2013.01);

(Continued)

(58) Field of Classification Search
CPC .......... H01R 13/6592; H01R 13/6594; H01R 13/6595; H01R 13/6587; H01R 13/6583; H01R 13/688; H01R 13/639
USPC ............... 439/607.55, 607.4, 607.41, 607.05
See application file for complete search history.

(56) References Cited

U.S. PATENT DOCUMENTS 5,073,130 A 12/1991 Nakamura
6,416,358 B1 * 7/2002 Kamarauskas .. H01R 13/65802
439/607.38

(Continued)

FOREIGN PATENT DOCUMENTS

CM CN201868687 U 6/2011
CN 2010029143 Y 2/2008

(Continued)

OTHER PUBLICATIONS

USB Type-C Specification 0.9c05-20140518.

(Continued)

*Primary Examiner* — Tulsidas C Patel
*Assistant Examiner* — Marcus Harcum
(74) *Attorney, Agent, or Firm* — Wei Te Chung; Ming Chieh Chang

(57) ABSTRACT

An electrical connector adapted for mounting on a printed circuit board, includes an insulating housing including a rear base and a front mating tongue, a plurality of contacts retained in the insulating housing and including contacting sections arranged on the mating tongue and mounting tails out of the insulating housing a shielding retained on the insulating housing and including a front mating port section thereby defining a mating cavity between the mating port section and the mating tongue and a metallic bracket attached on the shielding. The bracket defines a pair first supporting legs adjacent to the mating port sections which has no supporting leg split therefrom.

20 Claims, 50 Drawing Sheets

Related U.S. Application Data

14/477,889, filed on Sep. 5, 2014, and a continuation-in-part of application No. 14/454,737, filed on Aug. 8, 2014, now Pat. No. 9,385,459, and a continuation-in-part of application No. 14/337,180, filed on Jul. 21, 2014, now Pat. No. 9,318,853.

(60) Provisional application No. 61/953,737, filed on Mar. 15, 2014, provisional application No. 61/949,232, filed on Mar. 6, 2014, provisional application No. 61/926,270, filed on Jan. 11, 2014, provisional application No. 61/927,951, filed on Jan. 15, 2014, provisional application No. 61/916,147, filed on Dec. 14, 2013, provisional application No. 61/919,681, filed on Dec. 20, 2013, provisional application No. 61/917,363, filed on Dec. 18, 2013, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013.

(51) Int. Cl.
*H01R 107/00* (2006.01)
*H05K 1/11* (2006.01)
*H05K 1/18* (2006.01)

(52) U.S. Cl.
CPC ............... *H05K1/117* (2013.01); *H05K 1/184* (2013.01); *H05K 2201/09063* (2013.01); *H05K 2201/10189* (2013.01)

(56) References Cited

U.S. PATENT DOCUMENTS

| | | | |
|---|---|---|---|
| 6,755,689 B2 | 6/2004 | Zhang et al. | |
| 7,758,379 B2 | 7/2010 | Chen | |
| 7,824,220 B2 * | 11/2010 | Chen | H01R 13/6477 439/607.35 |
| 7,922,535 B1 * | 4/2011 | Jiang | H01R 13/5205 439/271 |
| 8,038,480 B2 * | 10/2011 | Wei | H01R 13/502 439/607.01 |
| 8,052,467 B1 * | 11/2011 | Xie | H01R 13/5219 439/589 |
| 8,087,944 B2 | 1/2012 | Kumamoto et al. | |
| 8,262,414 B1 * | 9/2012 | Li | H01R 13/6273 439/607.35 |
| 8,348,688 B2 * | 1/2013 | Liu | H01R 13/5219 439/271 |
| 8,517,773 B2 | 8/2013 | Lee et al. | |
| 8,684,769 B2 * | 4/2014 | Kao | H01R 13/6471 439/607.28 |
| 8,696,383 B2 * | 4/2014 | Do | H01R 13/6581 439/607.35 |
| 8,968,031 B2 | 3/2015 | Simmel et al. | |
| 2010/0267261 A1 | 10/2010 | Lin | |
| 2011/0256766 A1 * | 10/2011 | Chiang | H01R 13/6595 439/607.27 |
| 2013/0095702 A1 | 4/2013 | Golko et al. | |
| 2013/0244436 A1 * | 9/2013 | Sandhu | B82Y 10/00 438/702 |
| 2014/0024257 A1 * | 1/2014 | Castillo | H01R 13/6585 439/607.05 |
| 2014/0073184 A1 * | 3/2014 | Zhao | H01R 13/6594 439/607.55 |
| 2014/0187105 A1 * | 7/2014 | Zhao | H01R 12/707 439/733.1 |
| 2014/0370751 A1 * | 12/2014 | Zheng | H01R 12/724 439/607.35 |
| 2015/0162684 A1 | 6/2015 | Amini et al. | |
| 2015/0171562 A1 | 6/2015 | Gao et al. | |
| 2015/0214673 A1 | 7/2015 | Gao et al. | |
| 2015/0214674 A1 | 7/2015 | Simmel et al. | |
| 2015/0295362 A1 | 10/2015 | Tziviskos et al. | |
| 2015/0340813 A1 | 11/2015 | Ng et al. | |
| 2015/0340815 A1 | 11/2015 | Gao et al. | |
| 2015/0340825 A1 | 11/2015 | Ng et al. | |

FOREIGN PATENT DOCUMENTS

| | | |
|---|---|---|
| CN | 201230066 Y | 4/2009 |
| CN | 101573840 A | 11/2009 |
| CN | 201623280 U | 11/2010 |
| CN | 201741935 U | 2/2011 |
| CN | 201741937 U | 2/2011 |
| CN | 102437482 A | 5/2012 |
| CN | 102544812 A | 7/2012 |
| CN | 202423735 U | 9/2012 |
| CN | 202737282 U | 2/2013 |
| CN | 103081253 A | 5/2013 |
| CN | 203242848 U | 10/2013 |
| CN | 203481540 U | 3/2014 |
| TW | M288035 | 2/2006 |
| TW | M357077 | 5/2009 |
| TW | I427870 | 6/2011 |
| TW | M414692 | 10/2011 |
| TW | M443957 | 12/2012 |
| TW | M453995 | 5/2013 |
| TW | M454654 | 6/2013 |
| WO | WO2009147791 | 12/2009 |
| WO | WO2013/020359 | 2/2013 |

OTHER PUBLICATIONS

Universal Serial Bus Type-C Cable and Connector Specification Revision 1.0 Aug. 11, 2014.
Universal Serial Bus Type-C Cable and Connector Specification Revision 0.7 Working Draft Jan. 2014.

* cited by examiner

FLIPPABLE ELECTRICAL CONNECTOR

CROSS REFERENCE TO RELATED APPLICATIONS

This application is a continuation-in-part of the application Ser. No. 14/497,205 filed Sep. 25, 2014, and a continuation-in-part of the copending application Ser. No. 14/591,927 filed Jan. 8, 2015, and the instant application further claims the benefit of, and priority to, U.S. Provisional Patent Application No. 61/953,737, filed Mar. 15, 2014, and 61/949,232, filed Mar. 6, 2014, the contents of which are incorporated entirely herein by reference.

BACKGROUND OF THE INVENTION

1. Field of the Invention

The present invention relates to an electrical connector, and more particularly to a receptacle connector with an improved shielding.

2. Description of Related Art

In the previously filed provisional applications, the plug connector is "flippable" whereas we turn the plug over and it functions the same top and bottom. In order to be able to handle switching of the super speed signaling, a MUX (or SS switch) is built into the silicon. This can be costly and also cause some additional degredation in the super speed signals. Recently, a proposal for use with the future USB (Universal Serial Bus) was presented.

Hence, a new and simple electrical receptacle connector is desired to improve those disclosed in the aforementioned proposal.

SUMMARY OF THE INVENTION

Accordingly, the object of the present invention is to provide an electrical connector adapted for mounting on a printed circuit board, comprises an insulating housing comprising a rear base and a front mating tongue, a plurality of contacts retained in the insulating housing and comprising contacting sections arranged on the mating tongue and mounting tails out of the insulating housing a shielding retained on the insulating housing and comprising a front mating port section thereby defining a mating cavity between the mating port section and the mating tongue and a metallic bracket attached on the shielding. The bracket defines a pair first supporting legs adjacent to the mating port sections which has no supporting leg split therefrom.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
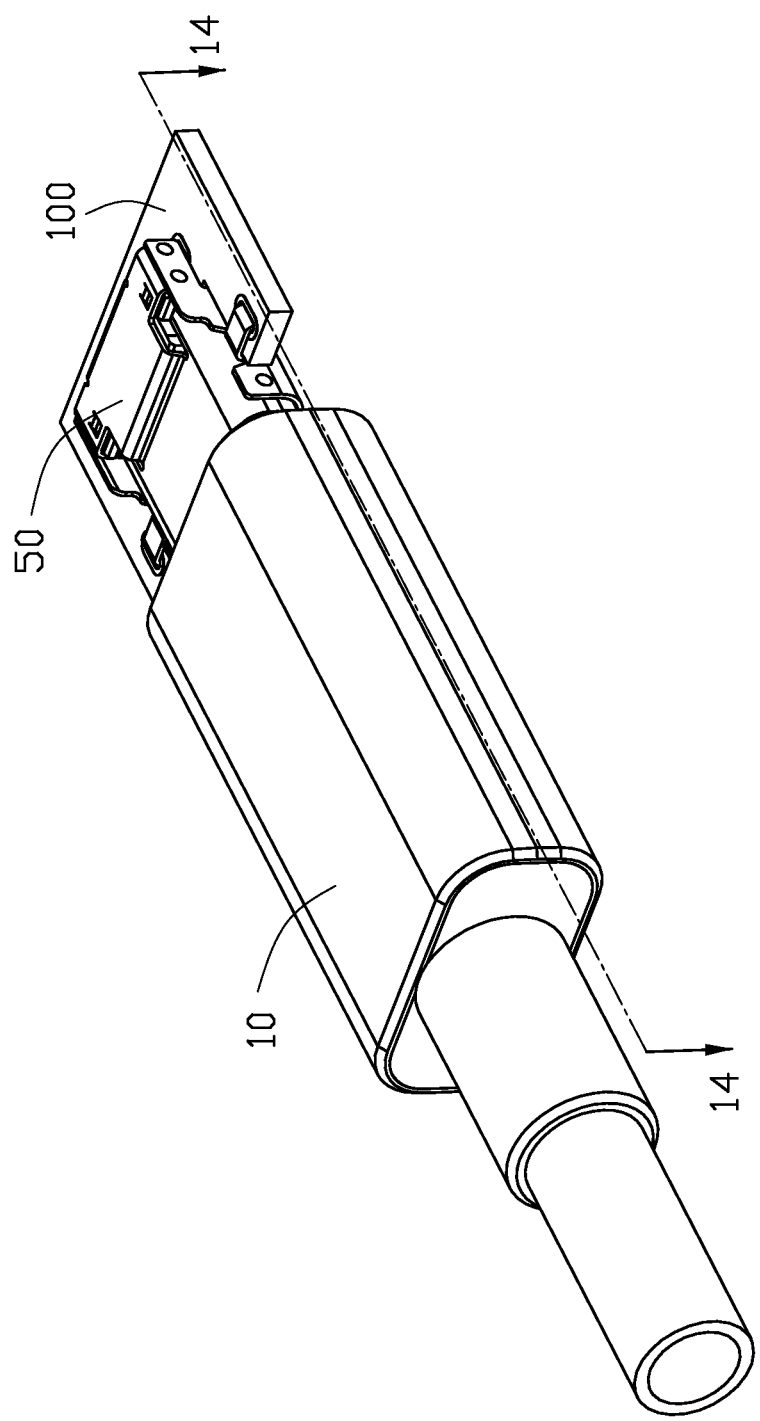
FIG. 1 is an assembled perspective view of a mated receptacle connector on a printed circuit board and a plug connector of the instant invention.
Figure 2A:
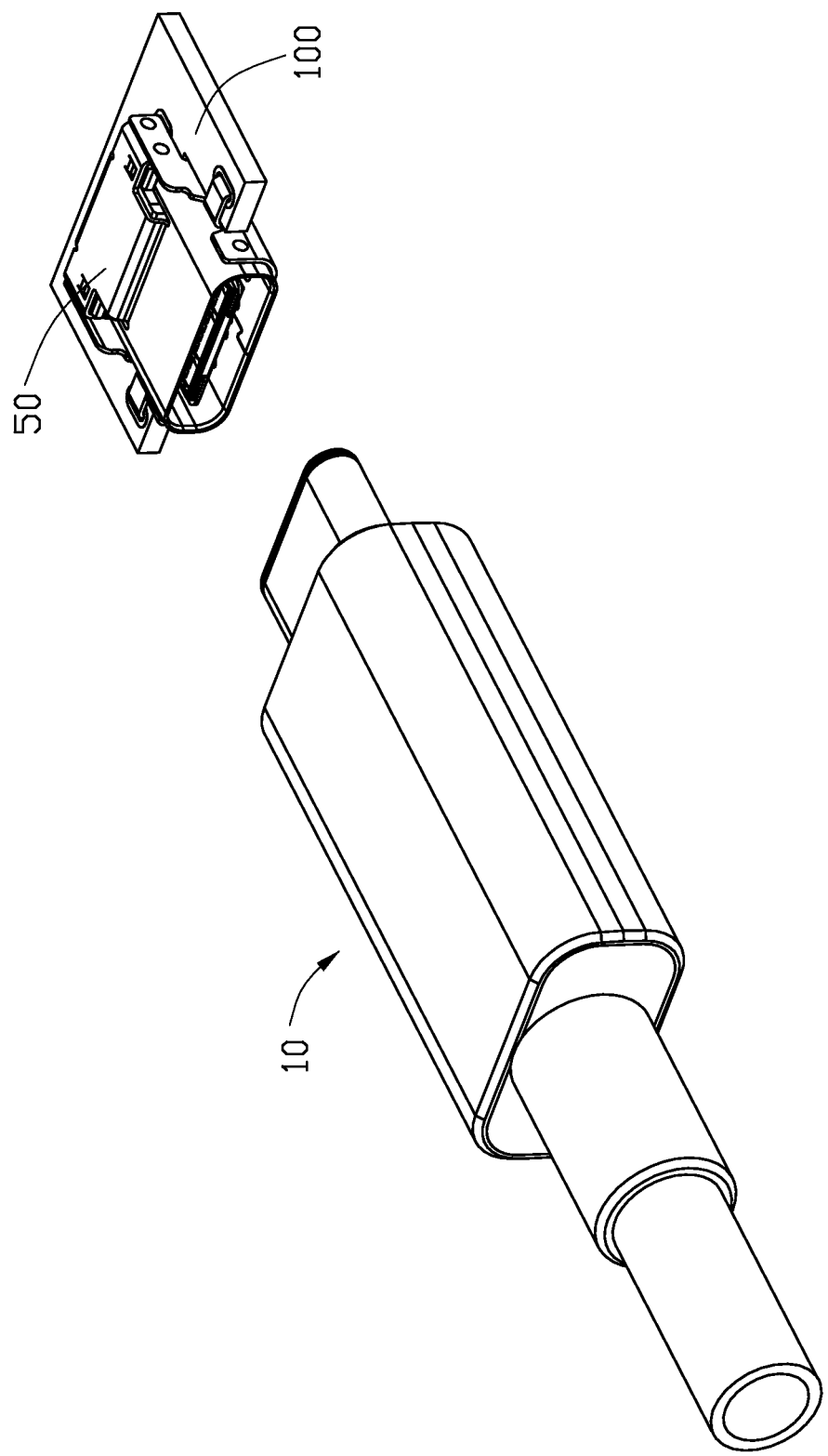
FIG. 2(A) is a front exploded perspective view of the receptacle connector and the plug connector of FIG. 1.
Figure 2B:
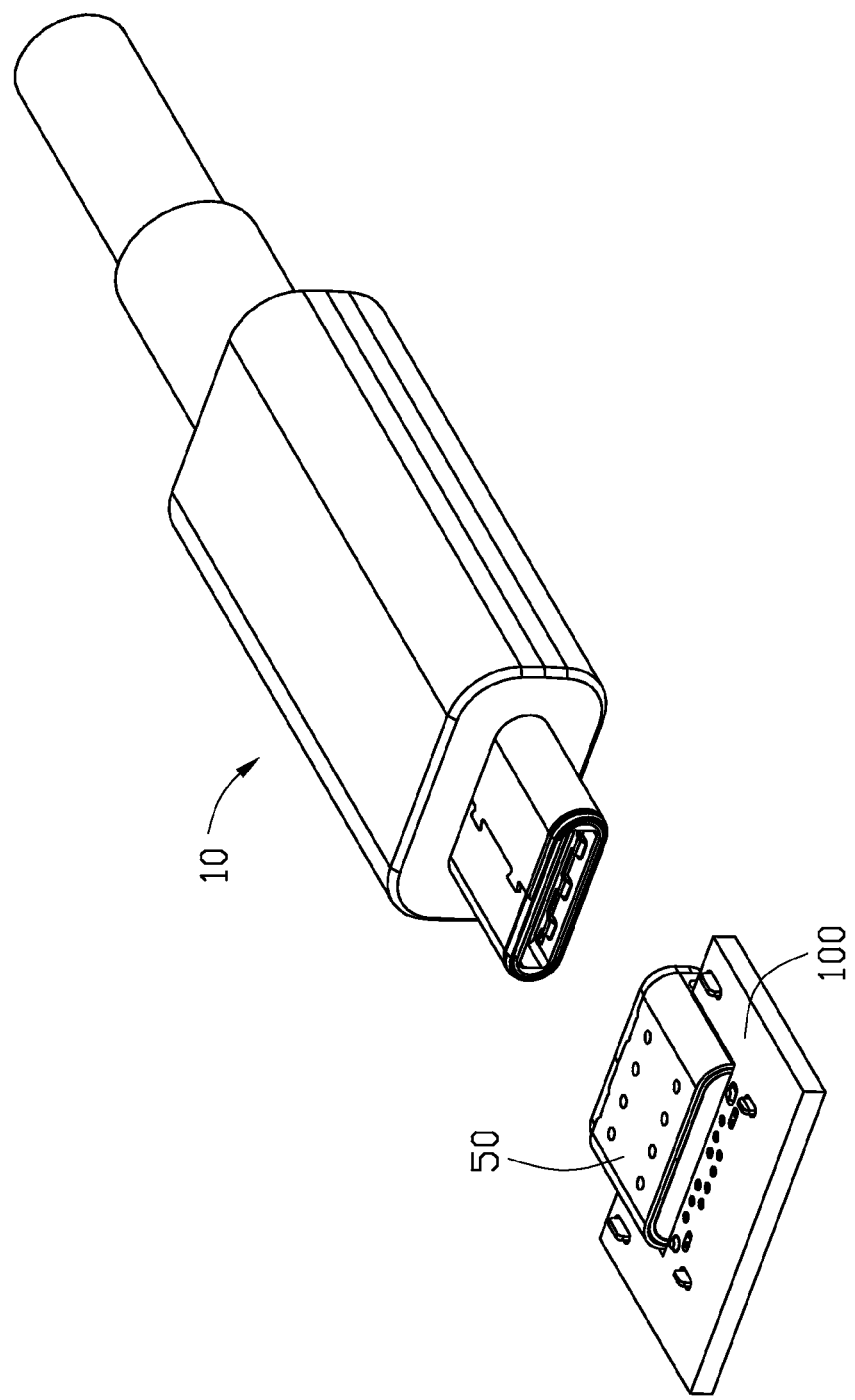
FIG. 2(B) is a rear exploded perspective view of the receptacle connector and the plug connector of FIG. 1.
Figure 3:
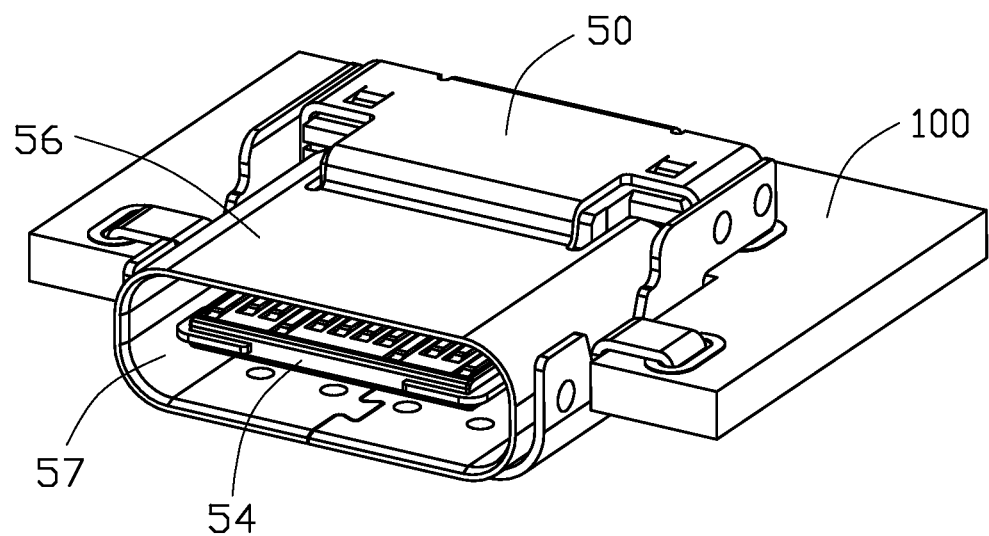
FIG. 3 is a front perspective view of the receptacle connector on the printed circuit board of FIG. 1.

FIGS. 1-2(B) show a plug connector 10 mated with a receptacle connector 50 mounted in a notch 102 of a printed circuit board 100. Referring to FIGS. 3-9, the receptacle connector 50 includes an insulative housing 52 with a mating tongue 54 forwardly extending in a capsular mating cavity 57 of a metallic shield 56 which encloses the housing 52. The mating tongue extends from a rear base 521. Opposite upper and lower rows of contacts 58 are disposed in the housing 52 with corresponding contacting sections 60 exposed upon opposite surfaces of the mating tongue 54 in a diagonally symmetrical arrangement mechanically and electrically so as to allow a so-called flappable insertion of the plug connector 10 thereinto. A step structure 62 is formed around a root of the mating tongue 54. A one piece metallic EMI collar 64 includes a loop structure 66 intimately surrounding the step structure 62.

The metallic shell 56 includes a capsular front mating port section 561 and a rear cover section 562 extending from a rear edge of the front mating section 561, the mating port section 561 surrounds the mating tongue 54 to define said mating cavity 57 between the mating port section and the mating tongue 54. The cover section 562 covers on the top surface of the rear base 521 of the base and a pair of sidewalls 565 downwards extending from opposite lateral sides of the cover section 561. A second supporting leg 55 extends downwards from each sidewall 565. The rear lower edge of the mating port section 561 is abutted against a front of the base to secure the metallic shielding 56.

The metallic bracket 95 is directly attached to a lower surface of the mating port section 561 of the metallic shielding 56. The mating port section 561 includes an upper and a lower wall 563 and two end walls 564 jointed with the upper and lower walls, the metallic bracket 95 is solder to the lower wall 563 of the mating port section. The metallic bracket 95 includes a lower wall 951 and two upward-extending sidewalls 952, each sidewall 952 extends rearwards an extending section 953. The lower wall 951 covers on the mating port section 561, the extending section 953 cover on the sidewall 565 of the cover section 562. Please notes, the lower wall 951, sidewalls 52 and the extending sections 953 have solder points. The metallic bracket 95 further defines a pair of supporting first legs 97 for mounting in the holes 102 of the PCB. Understandingly, the mating port section 561 has no supporting legs for PCB.

The housing 52 is composed of the upper piece 70 and a lower piece 72 commonly sandwiching therebeween a middle piece 74 which forms the mating tongue 54. The upper row contacts 58 are associated with the upper piece 70, the lower row contacts 58 associated with a lower piece 72 and the shielding plate 76 is associated with the middle piece 74 via an insert molding process wherein the contacting sections 60 of the upper row contacts 58 and those of the lower rows contacts 58 are seated upon opposite upper surface and lower surface of the mating tongue 54, respectively, as mentioned before. A rear portion of the step structure 62 is removed to have a front edge region 71 of the upper piece 70 and the front edge region 73 of the lower piece 72 sandwiched between the middle piece 74 and the loop structure 66 of the EMI collar 64 so as to enhance the strength during mating under some bending. In this embodiment, the shielding plate 76 defines an opening 77 and a thinner area 78 for both securing and impedance consideration, and further a pair of mounting legs 79 so as to efficiently separate the upper row contacts 58 and the lower row contacts 58 from each other wherein the upper row contacts 58 form the surface mount type tail sections while the lower row contacts 58 form the through hole type tail sections. The lower piece 72 includes a pair of mounting posts 80 for mounting the housing 52 to the printed circuit board 100.

In this embodiment, the middle piece 74 forms a pair of recesses 82 to respectively receive the corresponding protrusions 84 of the upper piece 70 and the lower piece 72 for securing the upper piece 70, the lower piece 72 and the middle piece 74 therebetween in a stacked manner wherein the upper piece 70 further include a pair of downward assembling poles 84 received in the corresponding alignment holes 86 of the middle piece 74, and the lower piece 72 further includes an upward assembling pole 85 received in the corresponding alignment holes 86 of the middle piece 74, and the lower piece 72 further forms a pair of upward locating posts 87 received within the corresponding recesses 89 in the upper piece 70. In this embodiment, the lower piece 72 defines a plurality of through holes 91 and 93 to receive the tail sections of the lower row contacts 58 and the mounting legs 79 of the shielding plate 76 to extend therethough as an alignment spacer. Notably, the shielding plate 76 forms a front edge section 69 extending forwardly beyond a front edge of the mating tongue 54 for anti-mismsting consideration, and a pair of lateral edge sections 67 for locking with a latch 39 of the plug connector 10 (illustrated later). In brief, the shielding plate 76 is essentially multifunctional to perform shielding, grounding, reinforcing, anti-mis-mating and locking. The metallic bracket 95 is soldered under the shield 56 and forms a pair of supporting legs 97 mounted to the printed circuit board 100 for supporting the receptacle connector 50 within the notch 102 of the printed circuit board 100. The shield 56 further includes a pair of mounting legs 55 for mounting to the printed circuit board 100 and a pair of locking tabs 59 received in the recesses 99 of the upper piece 70 after the shield 56 is rearwardly assembled to the housing 52 in a front-to-back direction.

Figure 14:
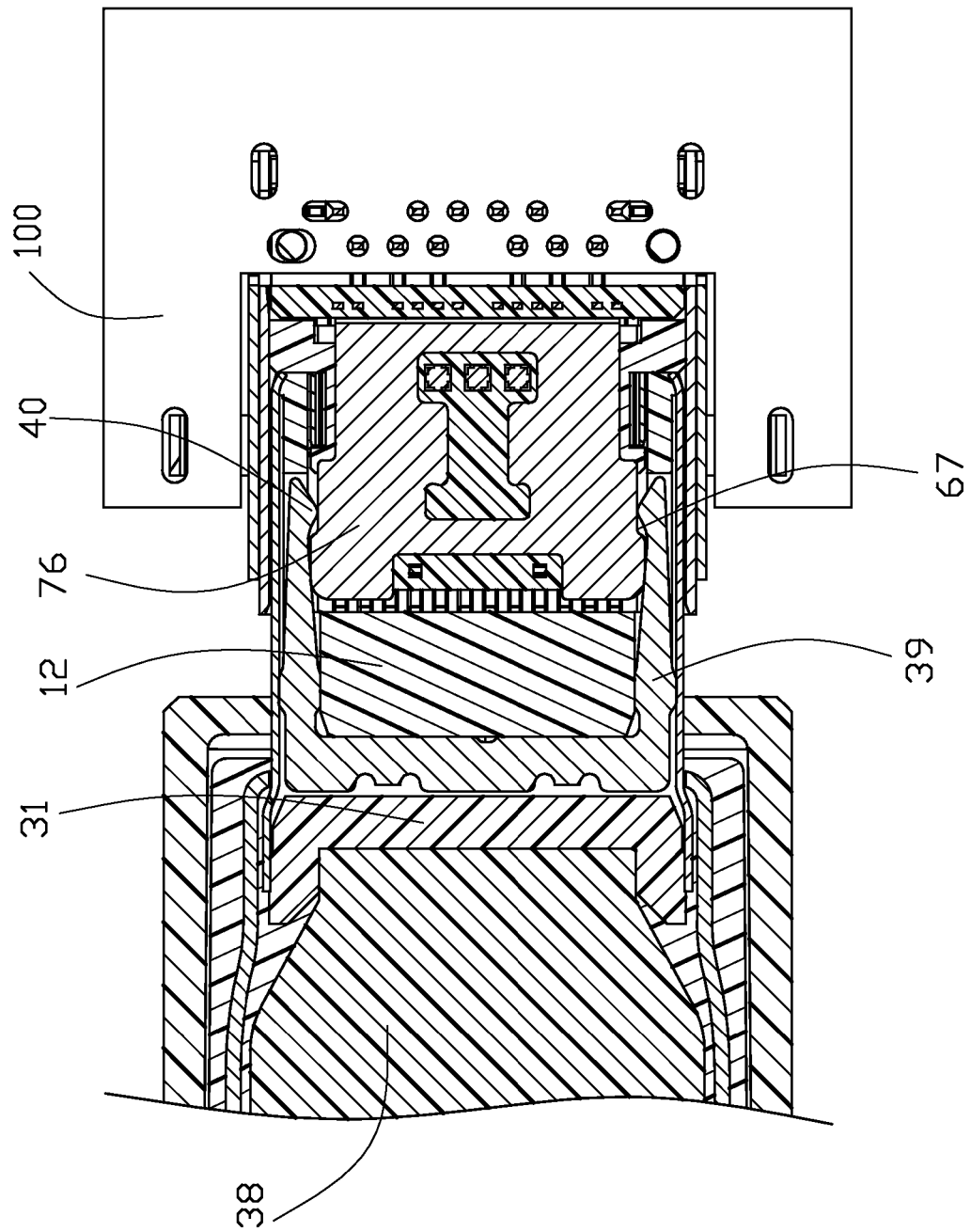
FIG. 14 is a cross-sectional view of the mated plug connector and receptacle connector taken along lines 14-14 of FIG. 1 to show how the latch of the plug connector is lockable engaged with the shielding plate of the receptacle connector.

Referring to FIGS. 10-13(B) and further FIG. 14, the plug connector 10 includes an insulative housing 12 having a capsular front contour with a rectangular receiving cavity 14 therein and enclosed in a metallic shell 16. Opposite upper and lower rows of contacts 18 are disposed in the corresponding passageways 32 of the housing with corresponding contacting sections 20 extending into the receiving cavity 14. A pair of upper and lower EMI (Electro-Magnetic Interference) spring plates 22 are enclosed in the shell 16, and each of the EMI spring plates 22 is sandwiched between the shell 16 and the housing 12 and includes a front resilient region 24 extending inwardly toward the receiving cavity 14 and in front of the contacting sections 20, a rear abutting region 26 to abut against the shell 16, and a pair of side retention regions 28 retainably engaged within corresponding side portions of the housing 12. A pair of tapes 30 are disposed upon two opposite sides of the housing 12 so as to isolate the contacting section 20 from the shell 16. A spacer 34 is located behind the housing and defines a plurality of passages 35 through which the tail sections 21 of the contacts 18 rearwardly extend. A recessed region 36 is formed in a rear face of the spacer 34 to receive a front edge region of a paddle card 38 wherein the tail sections 21 of the contacts 18 extending through the corresponding passages 35, are soldered upon the corresponding pads 37. The spacer 34 forms a forward extending blade 31 with a pair of forward protrusions 33 on two faces in the vertical direction to be commonly inserted into a back side of the housing 12 wherein the blade 31 is essentially received in the side slots 13 of the housing 12. A U-shaped metallic latch 39 received in the side slots 13 of the housing 12 with a pair of locking heads 40 extending into the two opposite lateral sides of the receiving cavity 14 to lock with the lateral edge sections 67 of the shielding plate 76 of the receptacle connector 50 during mating. Understandably, the latch 39 is restrained by the blade 31, the forward protrusions 33, the slots 13 and an interior rear face of the housing 12.

A cable 41 behind the paddle card 38, encloses a plurality of wires 42 regulated by a pair of organizer 43 to be soldered upon a rear region of the paddle card 38. An auxiliary rear shell 17 grasps the shell 16 to shield the paddle card 38, and a clipper 44 grasps the cable 41 behind the paddle card 38. Opposite front overcoat 45 and rear overcoat 46 are overmolded upon the rear shell 17 and the clipper 44, respectively. Finally, a cover 47 essentially fully covers the clipper 44, the front overcoat 45 and the rear overcoat 46. During mating, the mating tongue 54 is received in the receiving cavity 14 with the corresponding contacting sections 60 of the contacts 58 of the receptacle connector 50 connected to the contacting sections 20 of the contacts 18 of the plug connector 10 wherein the latch 39 is locked with the shielding plate 76, and the front resilient region 24 of the spring plate 22 contacts the collar 64.

Figure 15:
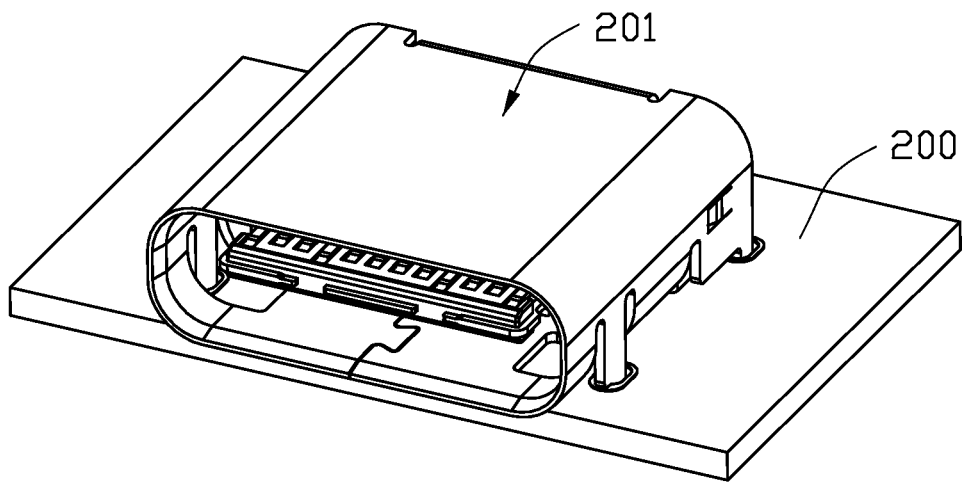
FIG. 15 shows a receptacle connector mounted upon a printed circuit board according to another embodiment of the invention.
Figure 16A:
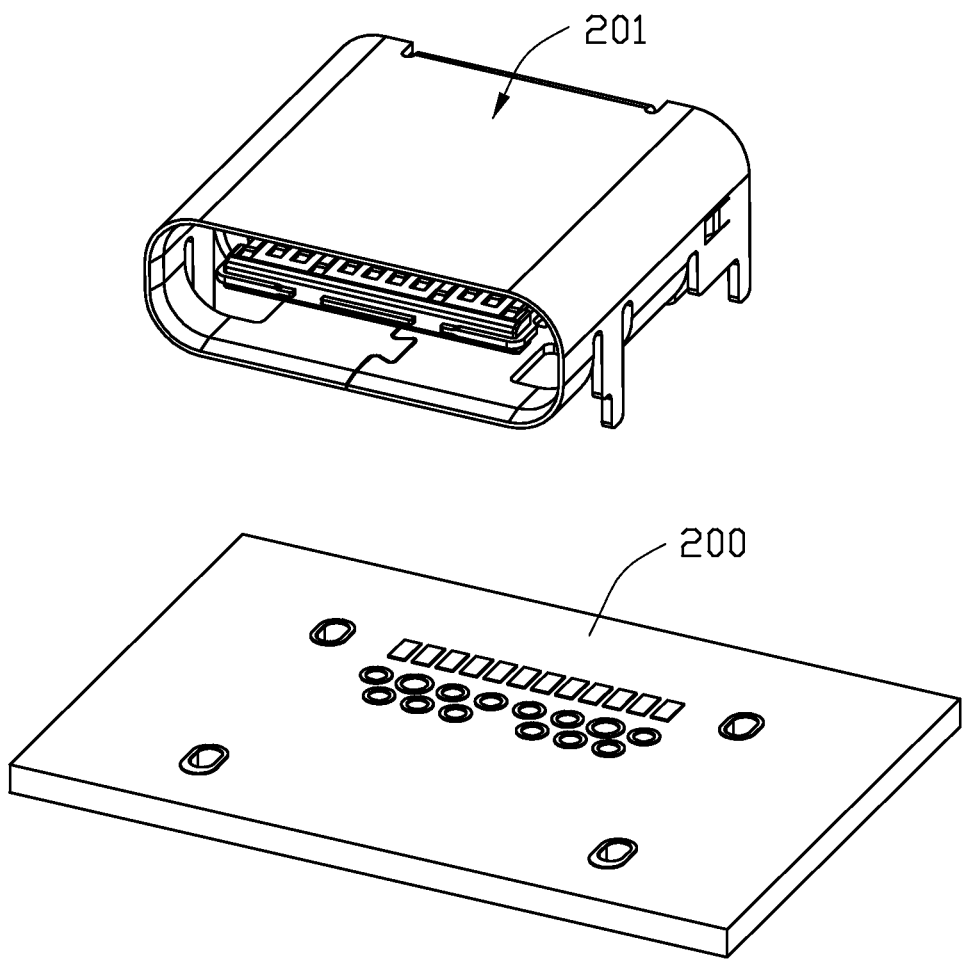
FIG. 16(A) is a front perspective view of the receptacle connector ready to be mounted to the printed circuit board of FIG. 15.
Figure 16B:
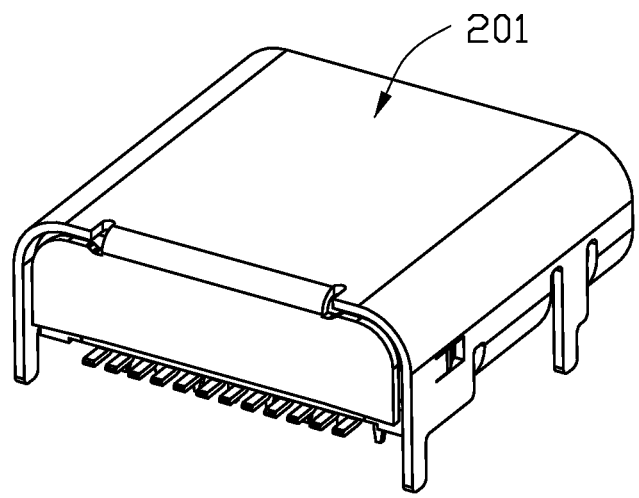
FIG. 16(B) is a rear perspective view of the receptacle connector ready to be mounted to the printed circuit board of FIG. 15.
Figure 16B:
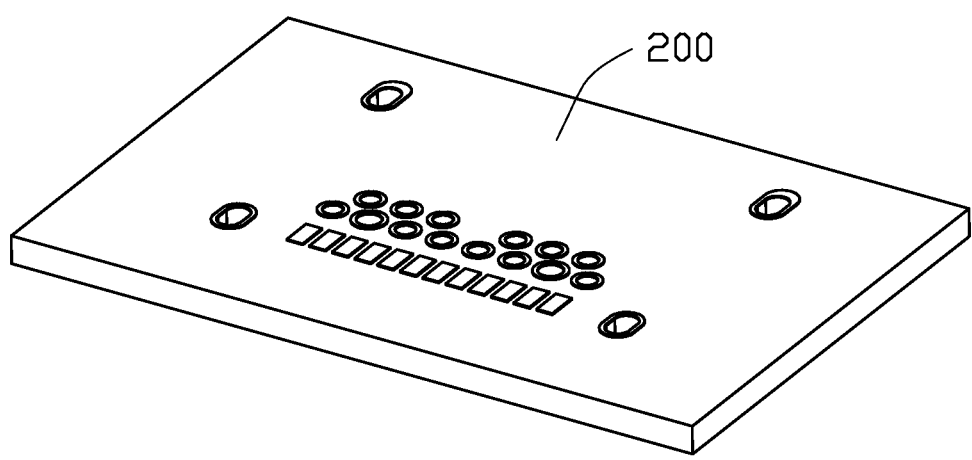
Figure 17:
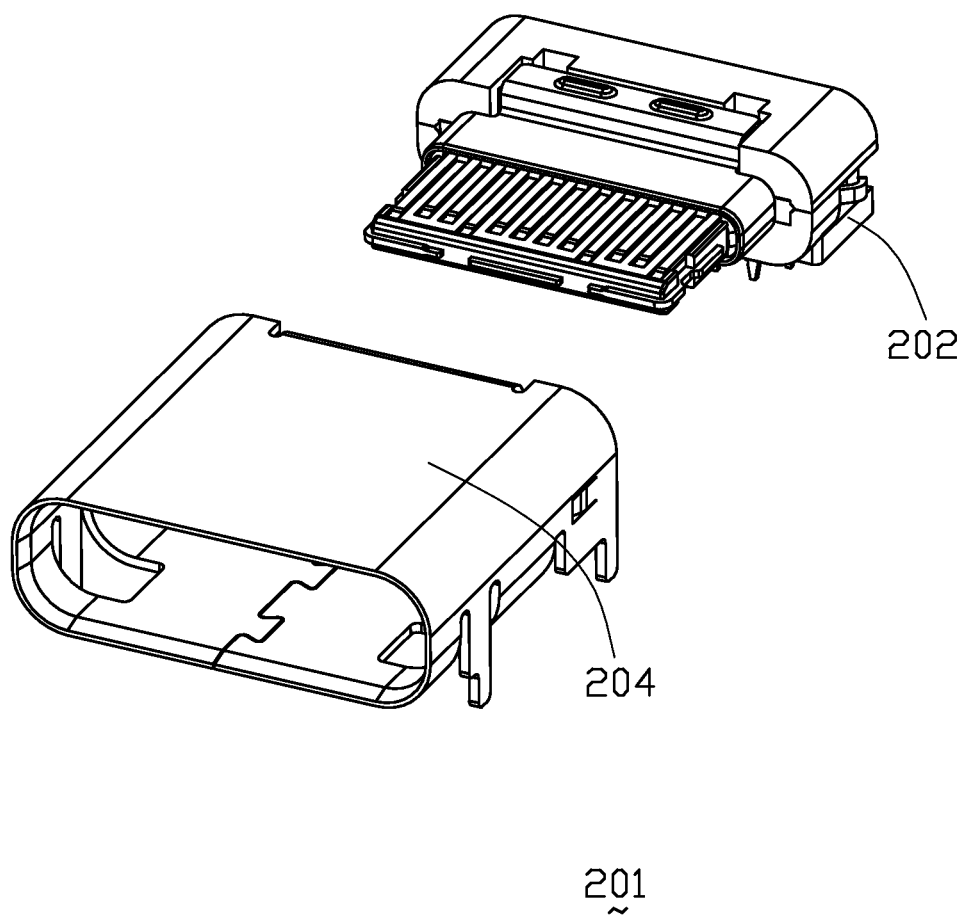
FIG. 17 is a front exploded perspective view of the receptacle connector of FIG. 16(A).

FIGS. 15-17 show the receptacle connector 201 substantially fully mounted upon the printed circuit board 200 instead of being partially within the notch of the printed circuit board 200 wherein the shielding plate is further equipped with the side spring finger 202 to mechanically and electrically contact the shield 204 of the receptacle connector 201.

Figure 18A:
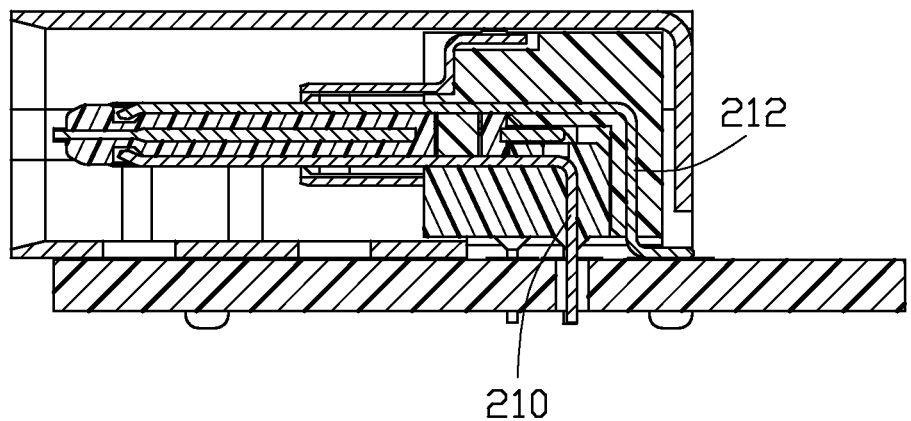
FIG. 18(A) is a cross sectional view of another embodiment of the receptacle connector mounted upon the printed circuit board with one row through hole type contact tails and one row surface mount type contact tails.
Figure 18B:
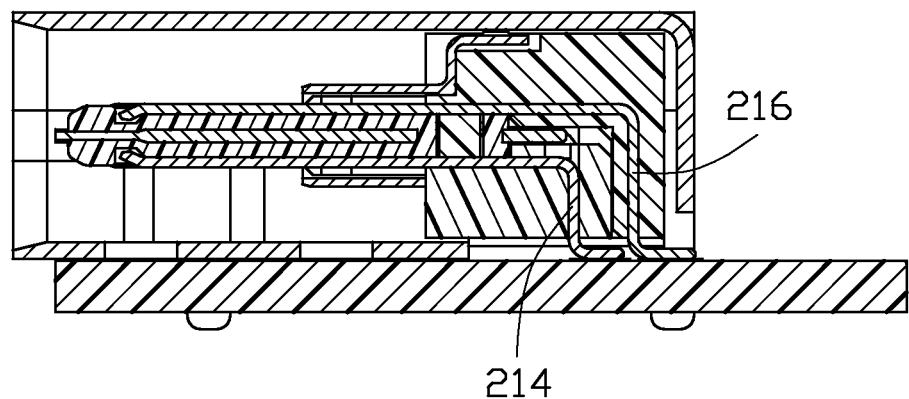
FIG. 18(B) is a cross sectional view of another embodiment of the receptacle connector mounted upon the printed circuit board with both two rows surface mount type contact tails in the same direction.
Figure 18C:
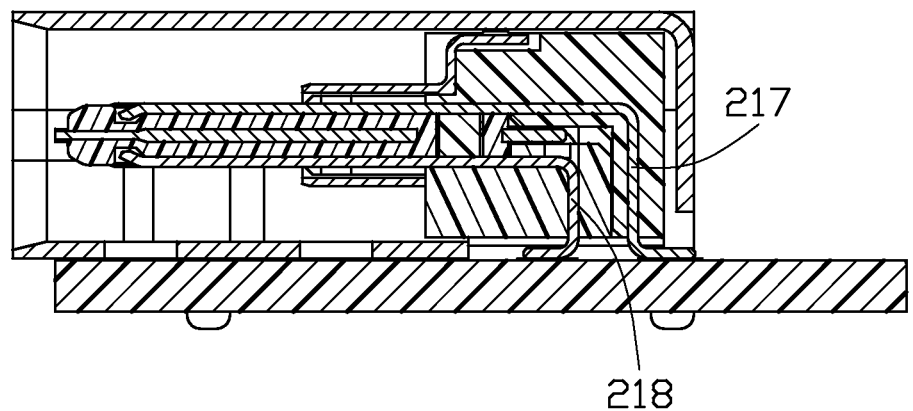
FIG. 18(C) is a cross sectional view of another embodiment of the receptacle connector mounted upon the printed circuit board with both two rows surface mount type contact tails in the opposite directions.
Figure 18D:
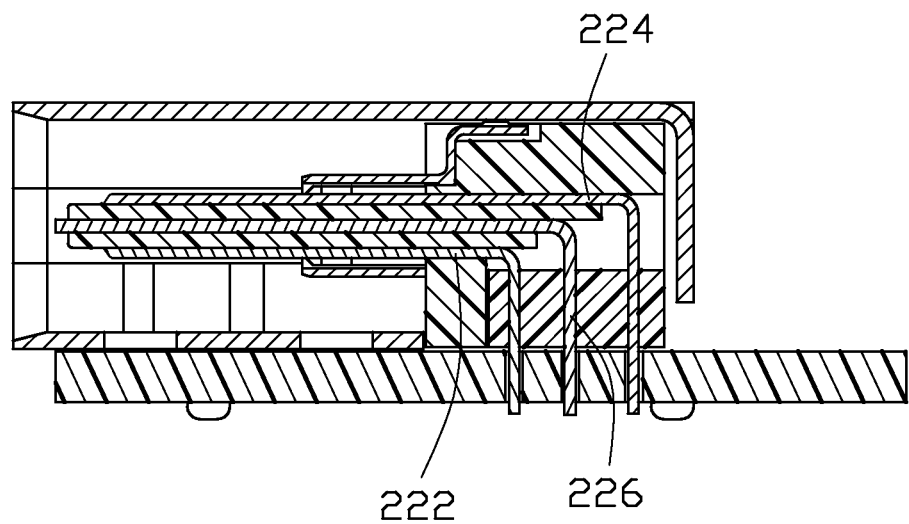
FIG. 18(D) is a cross sectional view of another embodiment of the receptacle connector mounted upon the printed circuit board with two rows through hole type contact tails.
Figure 18E:
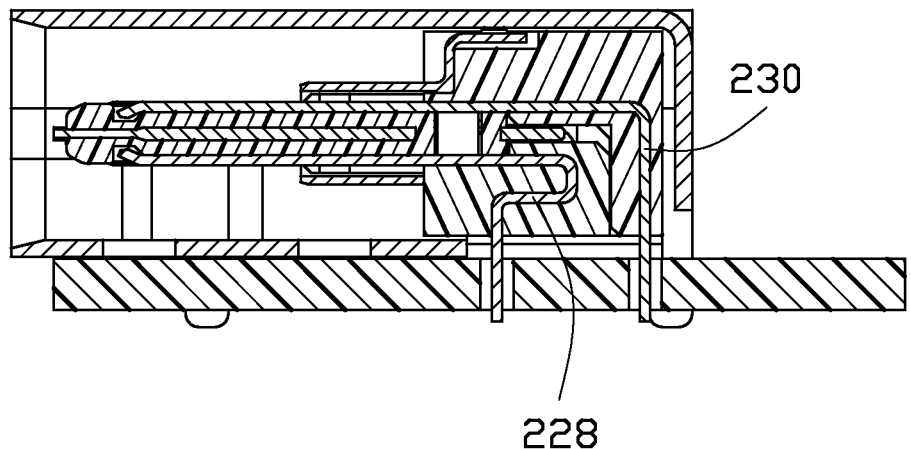
FIG. 18(E) is a cross sectional view of another embodiment of the receptacle connector mounted upon the printed circuit board with two rows through hole type contact tails wherein the upper row contacts and the lower row contacts have the same length.

FIG. 18(A) shows the upper row contacts insert molded with the upper insulative piece with the surface mount type contact tails 212 and the lower contacts insert molded with the lower insulative piece with the through hole type contact tails 210, similar to the first embodiment. FIG. 18(B) shows the surface mount type contact tails 214, 216 for both two rows in the same direction. FIG. 18(C) shows the surface mount type contact tails 217, 218 for both two rows in the opposite directions. FIG. 18 (D) shows the through hole type contact tails 222, 224 for both two rows wherein both two rows contacts are assembled into the housing rather than being insert molded therewith. Alternately, one row contacts may be insert molded with an insulator or the housing. A spacer (not labeled) is provided to align the contact tails 222, 224 of both two rows contacts including the mounting leg 226 of the shielding plate. FIG. 18 (E) shows the lower row contact tail 228 extends in a serpentine manner to increase the length thereof so as to have the similar length with the upper row contact tail 230 for compensating the skew effect therebetween.

Figure 19:
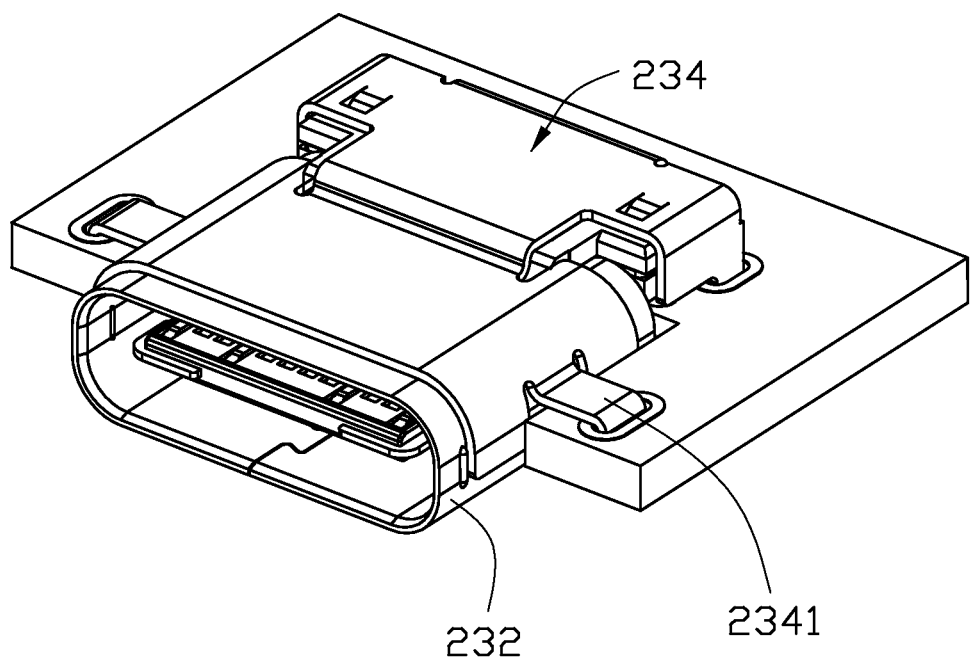
FIG. 19 is another embodiment of the receptacle connector mounted upon the printed circuit board according to the invention to show the upper bracket attached upon the top of the shield.
Figure 20A:
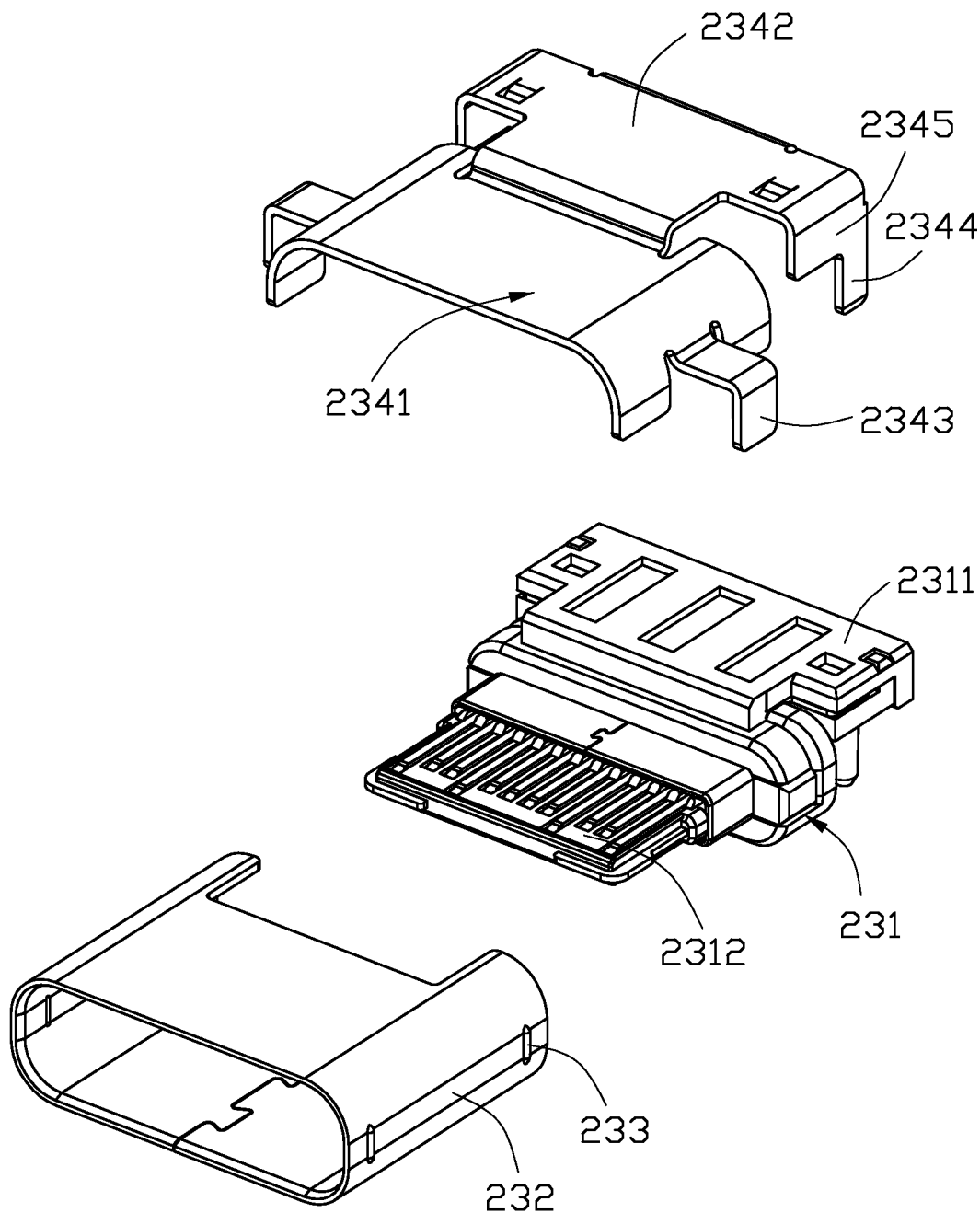
FIG. 20(A) is a front exploded perspective view of the receptacle connector of FIG. 19.
Figure 20B:
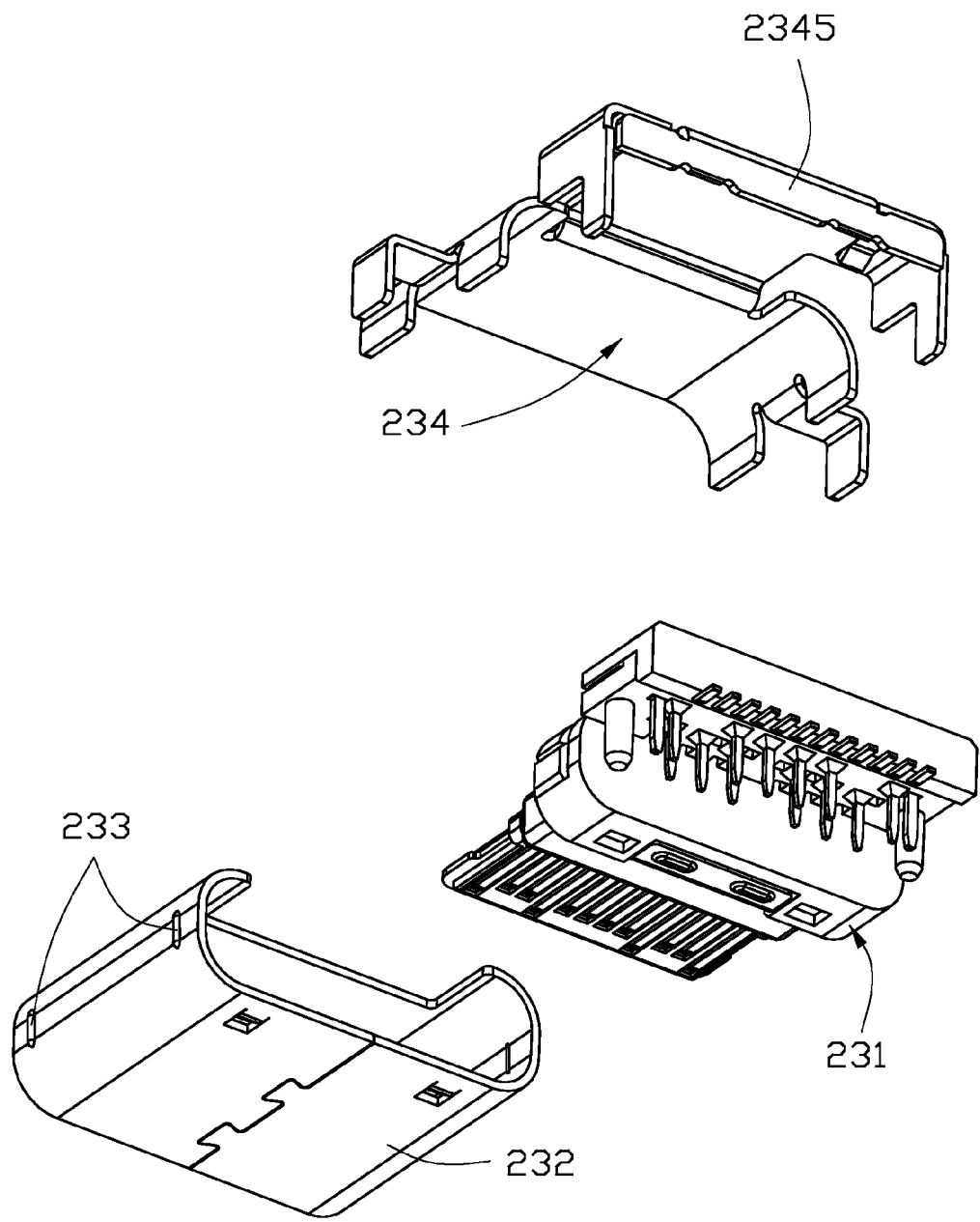
FIG. 20(B) is a rear exploded perspective view of the receptacle connector of FIG. 19.

FIGS. 19-20(B) show the top loading type metallic bracket 234 equipped with mounting legs for mounting to the printed circuit board, and soldered upon the metallic shield 232 of the receptacle connector wherein the housing 231 is assembled to the shield 232 while the rear base portion 2311 of the housing 231 is protectively hidden below the rear cover section 2342 of the bracket 234. The shield 232 forms a pair of protrusions 233 to restrain the bracket 234. The shielding 232 is only a mating port section, which surrounding the mating tongue 2312. The rear edge of the mating port section is retained around the rear base 2311 of the housing. A top wall 2341 of the bracket 231 cover on the shielding 232 and a rear cover section 2342 extend rearwards from the top wall 2341 covers on a top of the rear base 2311 of housing 231 to secure the rear base of the housing. A pair of first supporting leg 2343 downwards extends from the top wall 2341 and a pair of second supporting legs 2344 extends downwards from two sidewalls 2345 of the rear cover section. A rear wall 2345 downwards bends from the rear cover section. From FIGS. 5(A) and 20(A), the front mating port section 561/232 of the shielding has no supporting legs split therefrom so that an improved shielding function is obtained.

Figure 21:
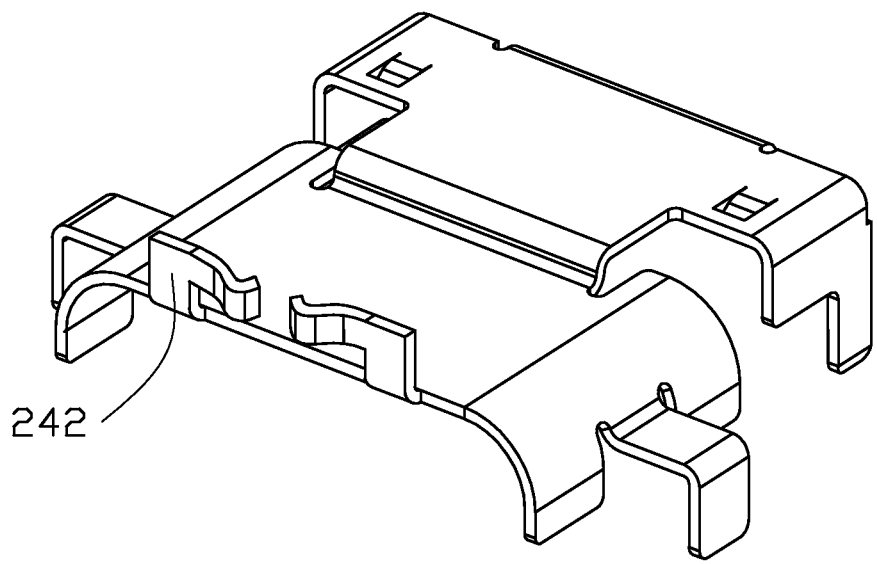
FIG. 21 shows another embodiment of the bracket of the receptacle connector according to the invention.

FIG. 21 shows the metallic bracket 240 with two spring fingers 242 on the front edge for abutting against the back panel of the computer case, the spring fingers extends parallel and facing each other.

Figure 4:
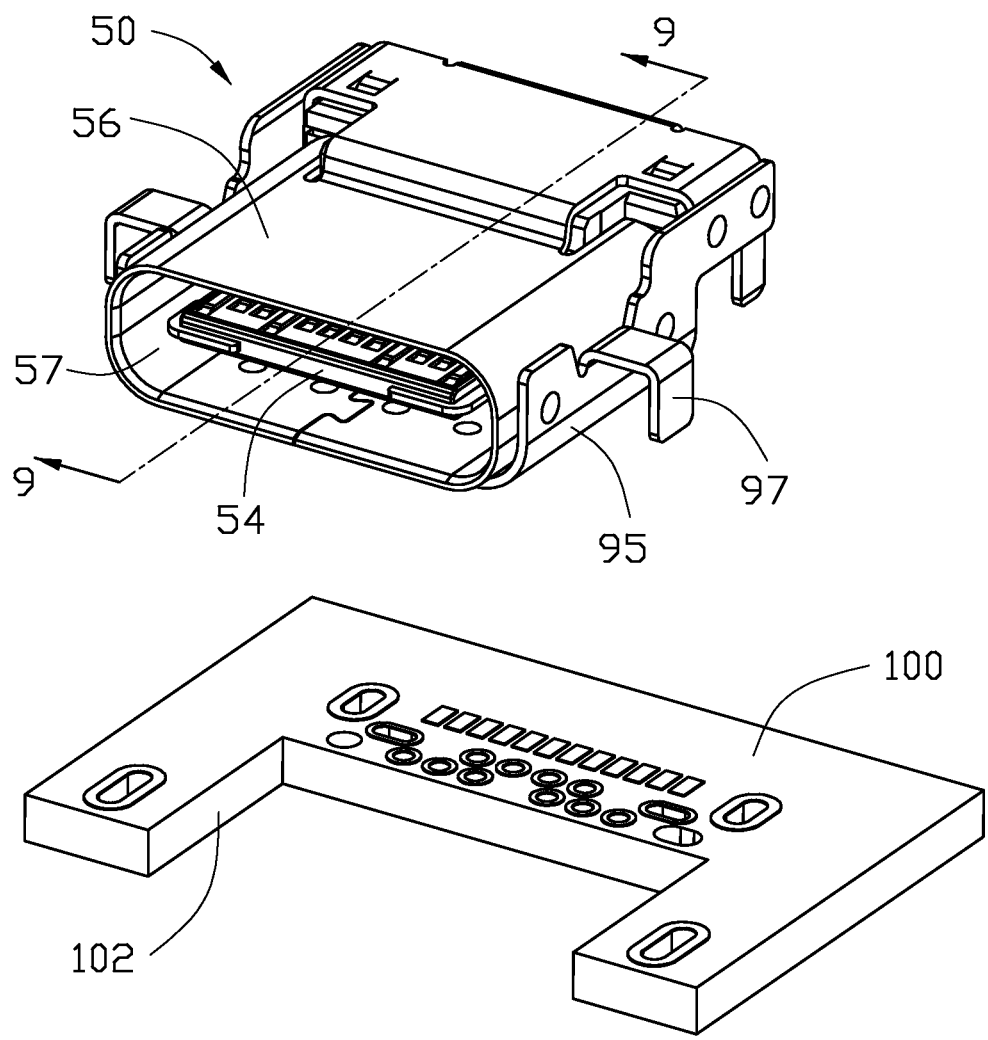
FIG. 4 is a front perspective view of the receptacle connector spaced from the printed circuit board of FIG. 1.
Figure 22:
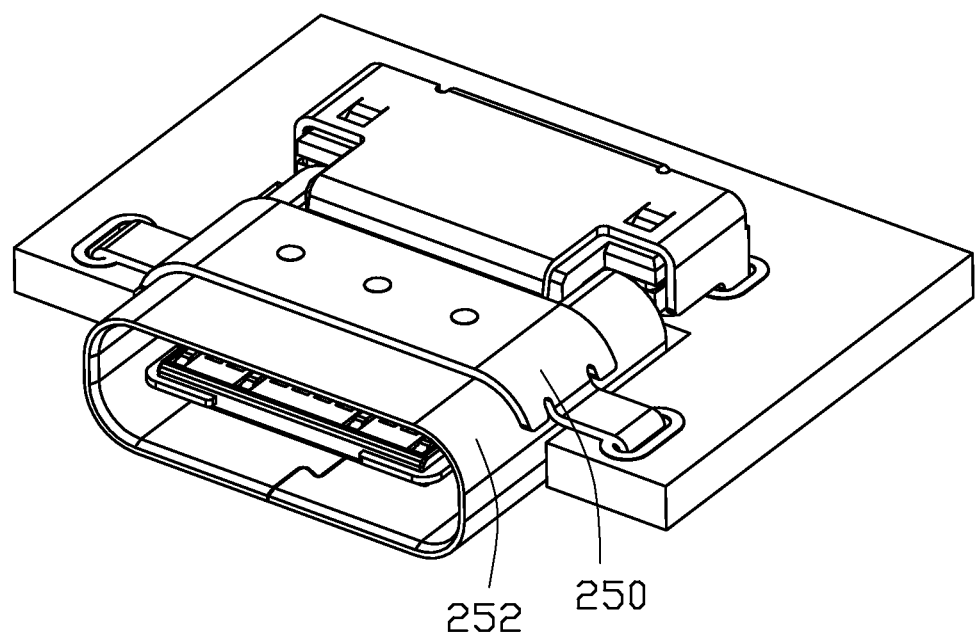
FIG. 22 is an assembled perspective view of the receptacle connector mounted upon the printed circuit board of another embodiment according to the invention.
Figure 23:
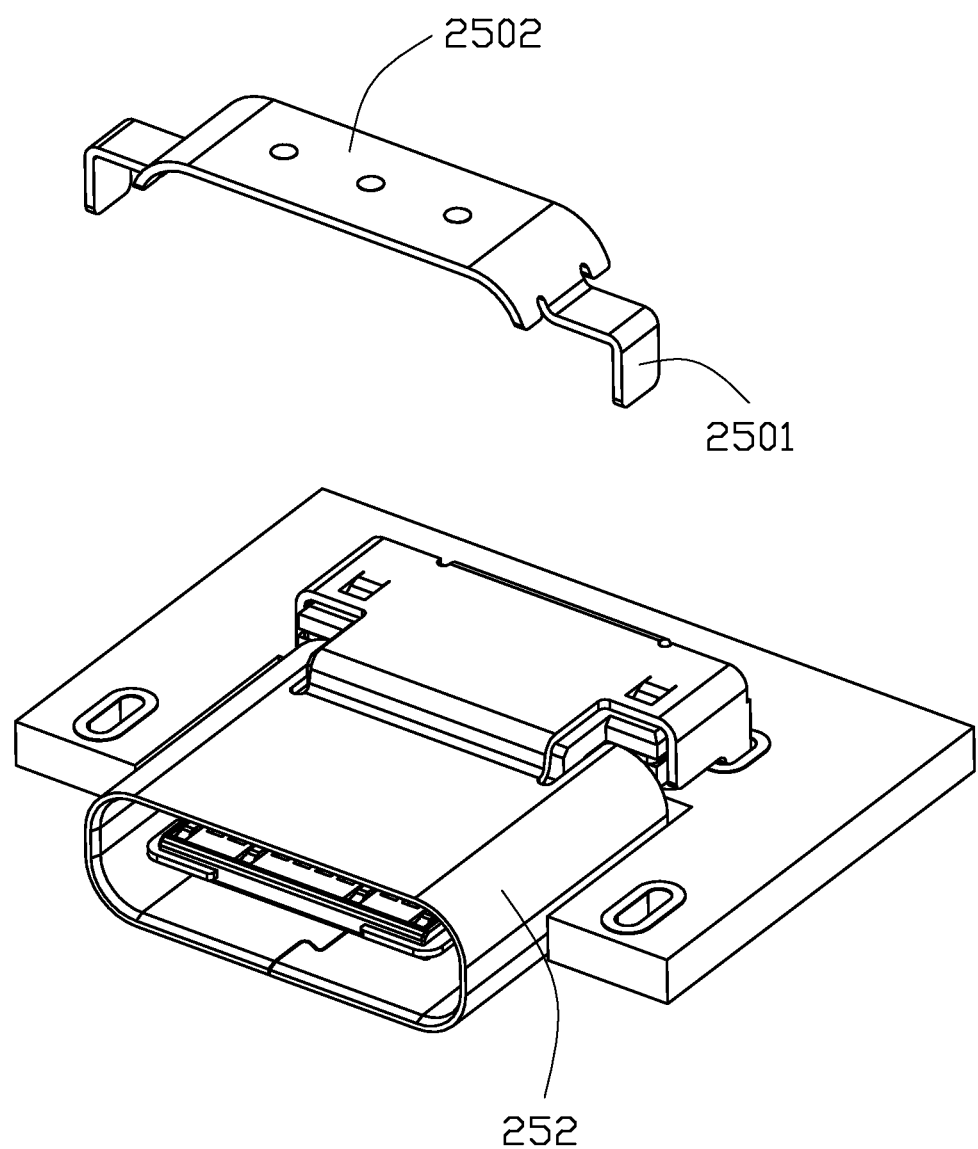
FIG. 23 is an exploded perspective view of the receptacle connector on the printed circuit board of FIG. 22.
Figure 24:
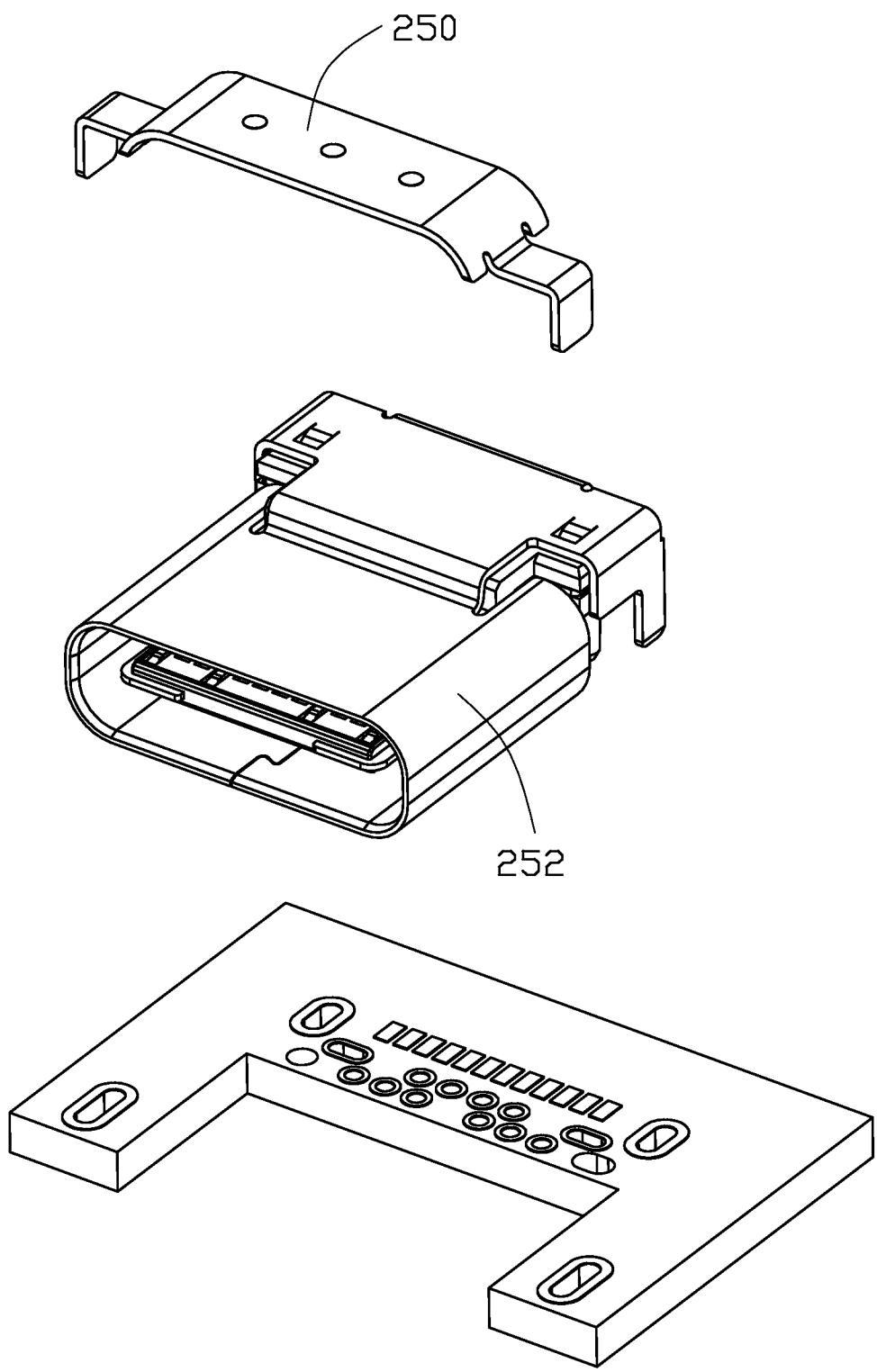
FIG. 24 is an exploded perspective view of the receptacle connector away from the printed circuit board of FIG. 22.

FIGS. 22-24 show the metallic bracket 250 soldered upon the top side of the shield 252 of the receptacle connector wherein different from the previous embodiment shown in FIG. 19, the bracket 250 with a pair of first supporting legs 2501, does not provide the rear wall to cover the rear portion of the housing but the shield 252 provides. The shielding 252 is same to the previous embodiment shown in FIG. 4 wherein different from the previous embodiment shown in FIG. 4 is that the metallic bracket has a top wall 2502 and a pair of first supporting legs 2501. The top wall 2502 is soldered on the top wall of the mating port section of the shield.

Figure 5A:
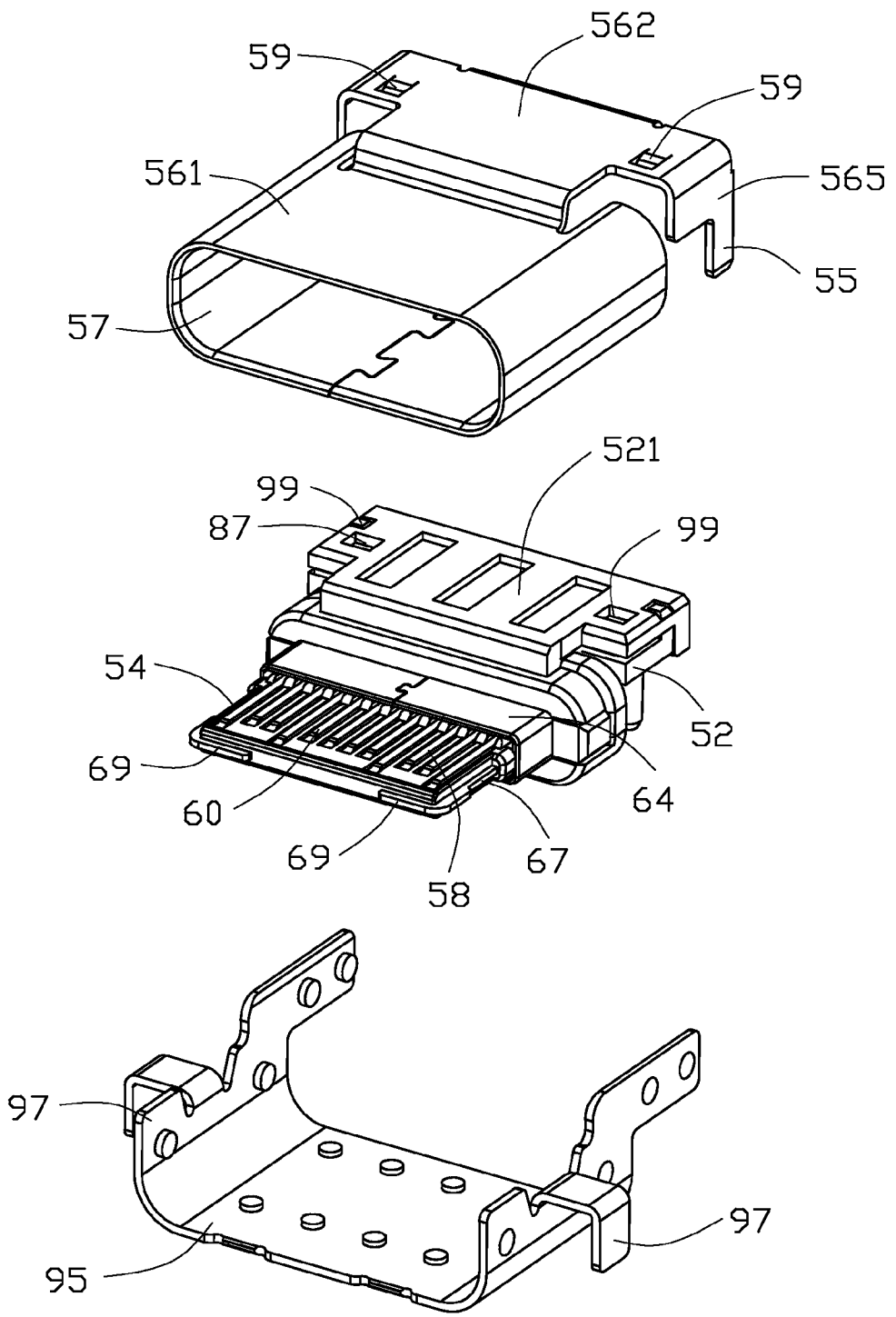
FIG. 5(A) is a front partially exploded perspective view of the receptacle connector of FIG. 1.
Figure 5B:
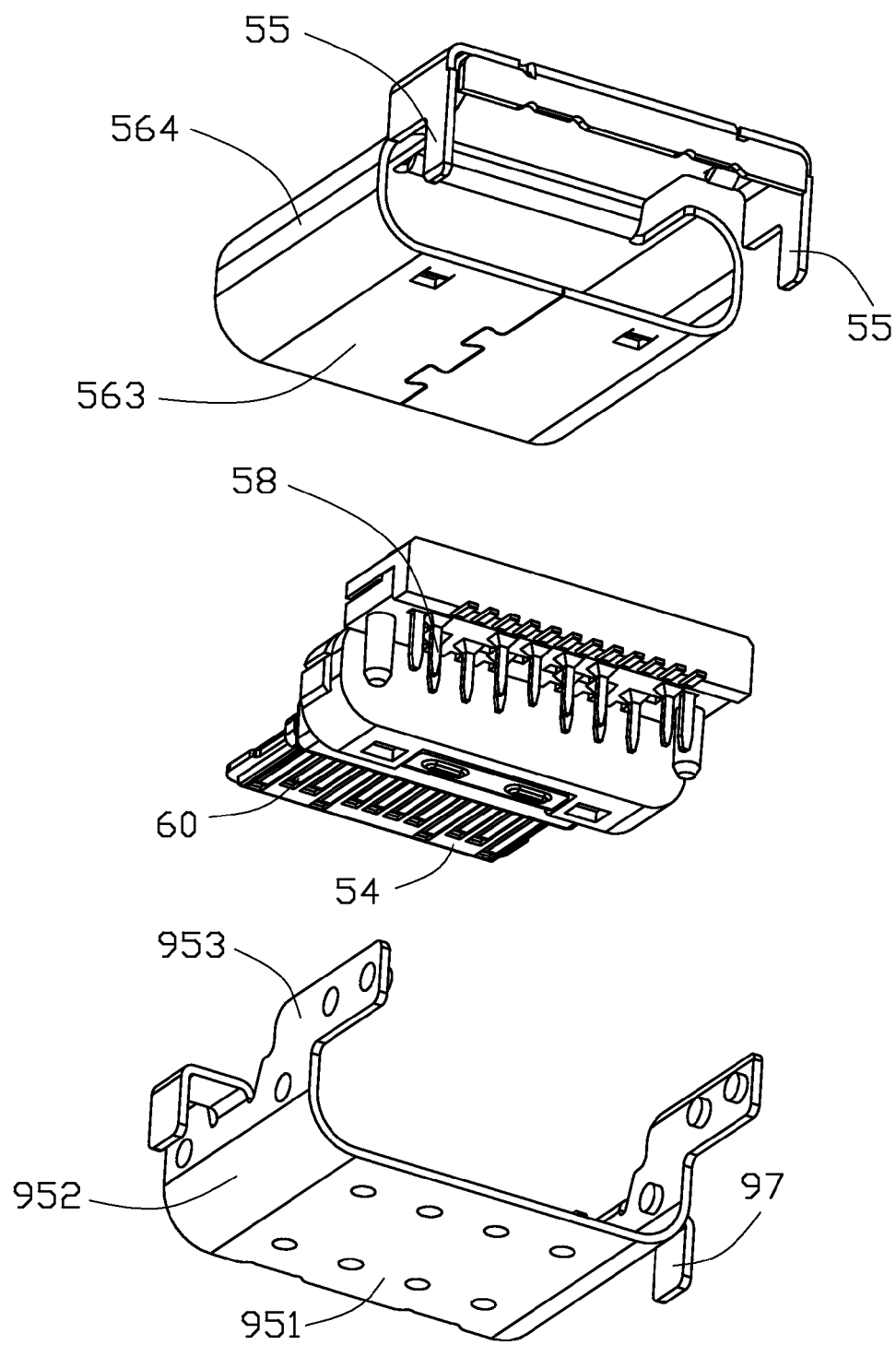
FIG. 5(B) is a rear partially exploded perspective view of the receptacle connector of FIG. 1.
Figure 6:
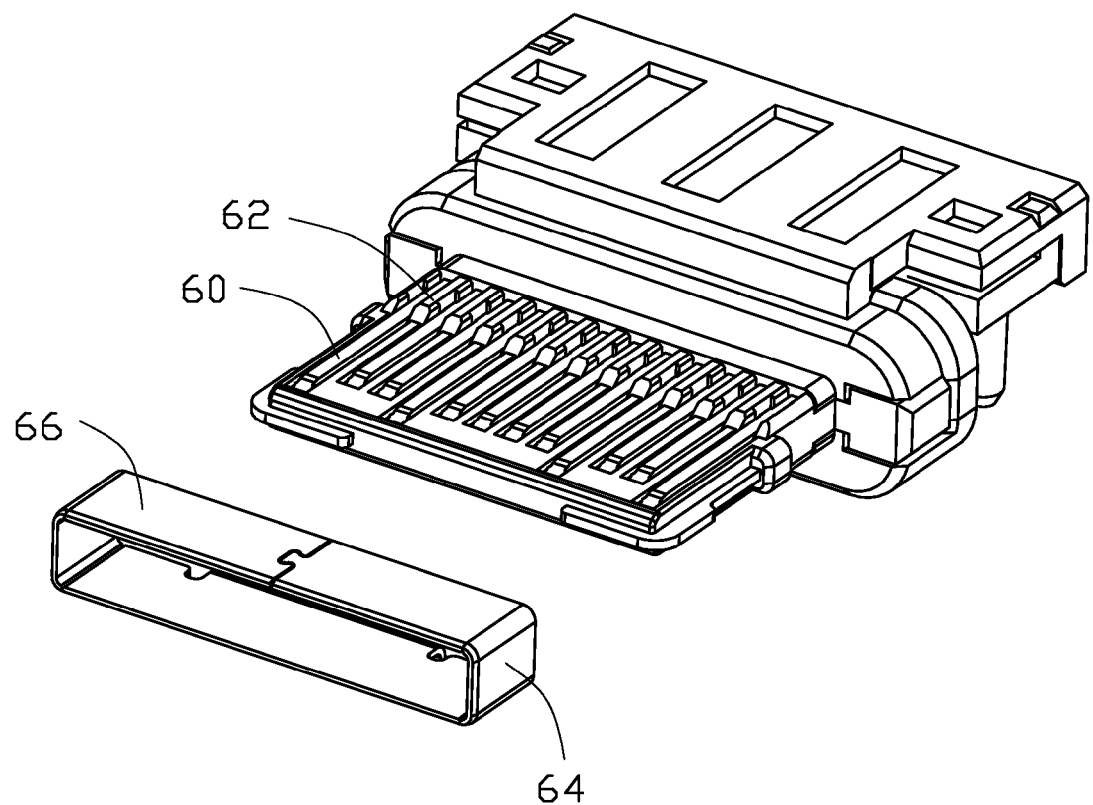
FIG. 6 is a front partially exploded perspective view of the receptacle connector of FIG. 1 without the shield thereof.
Figure 7A:
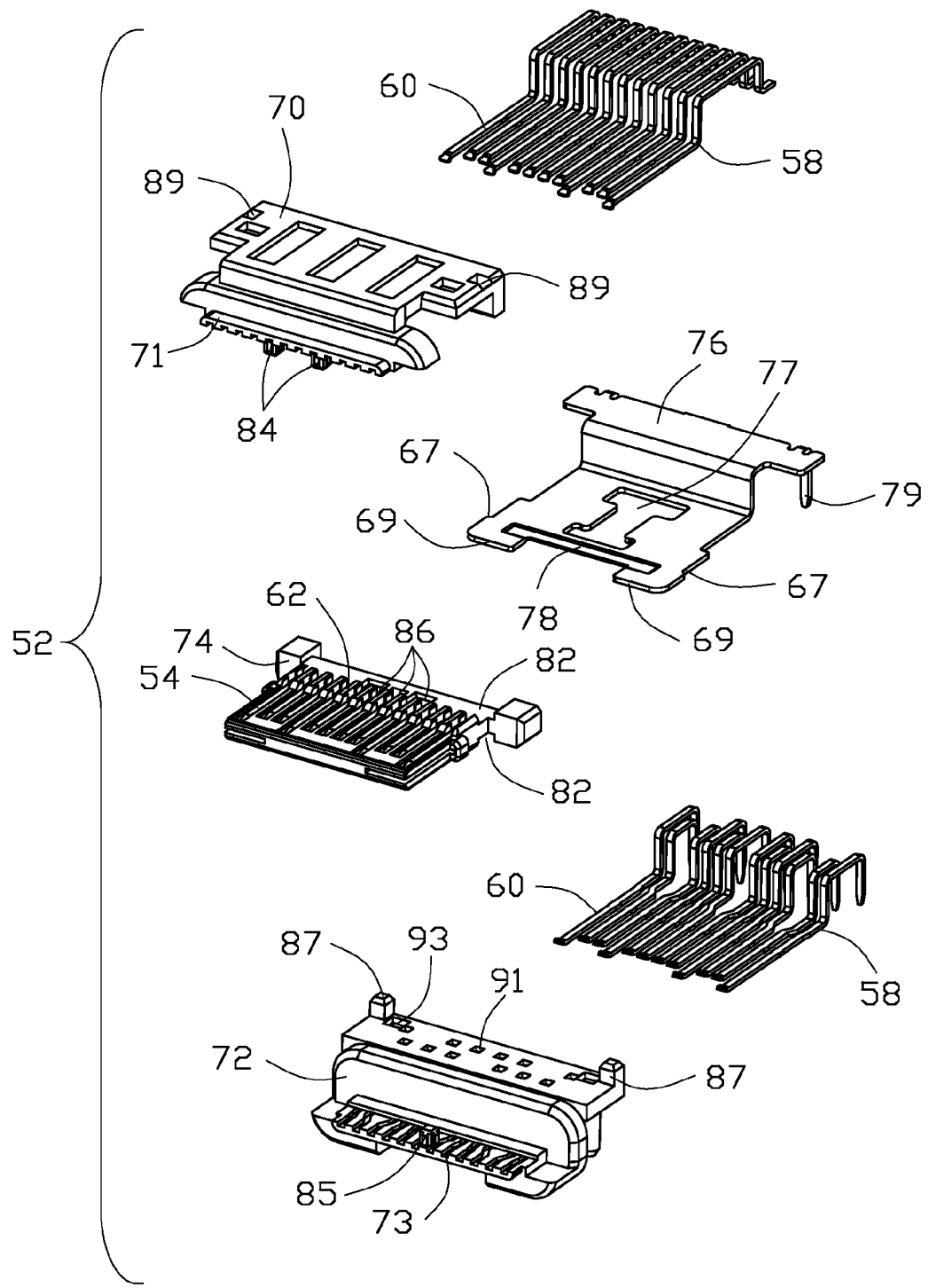
FIG. 7(A) is a front partially exploded perspective view of the receptacle connector of FIG. 1 to show the housing and the contacts thereof.
Figure 7B:
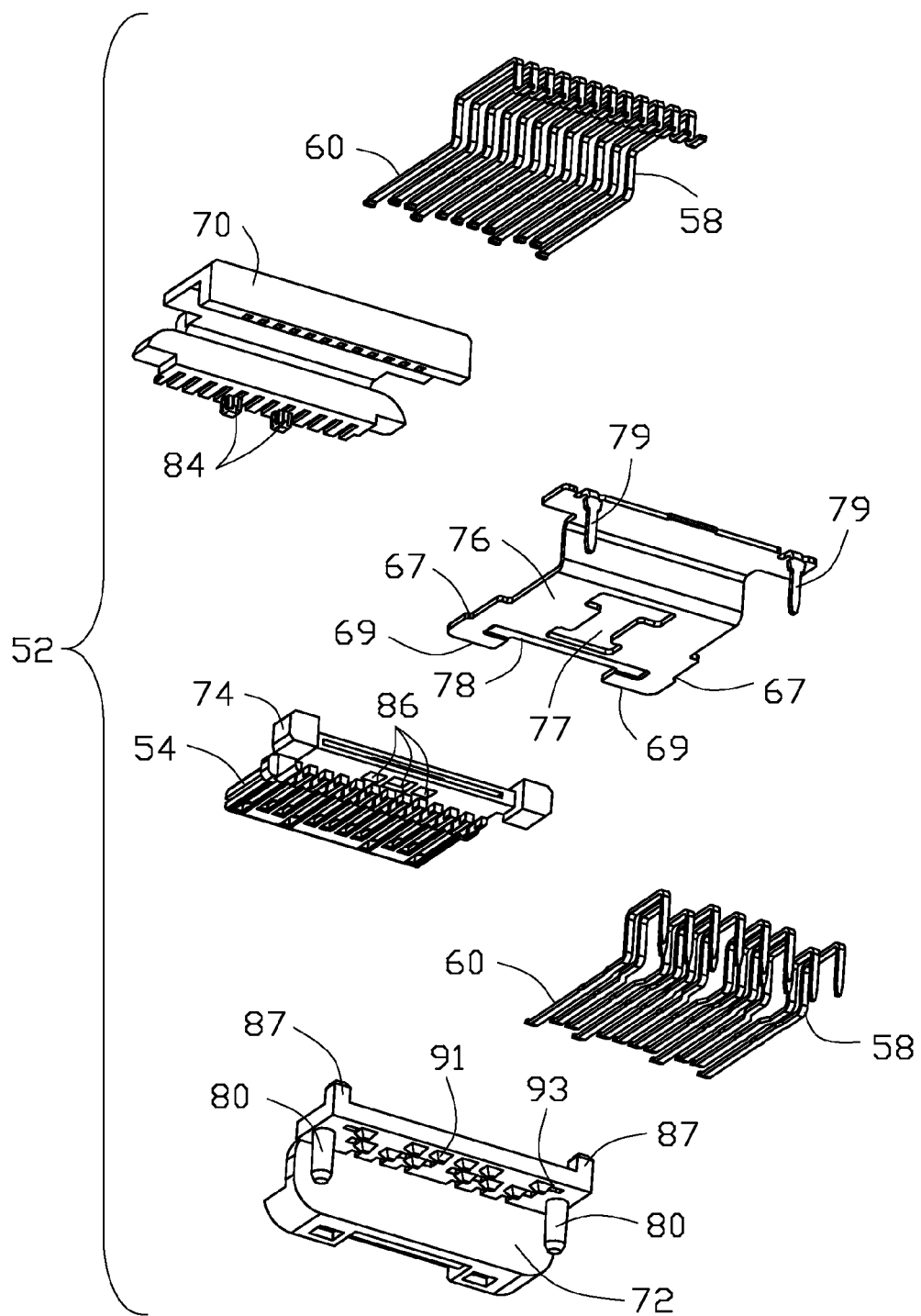
FIG. 7(B) is a rear partially exploded perspective view of the receptacle connector of FIG. 1 to show the housing and the contacts thereof.
Figure 8A:
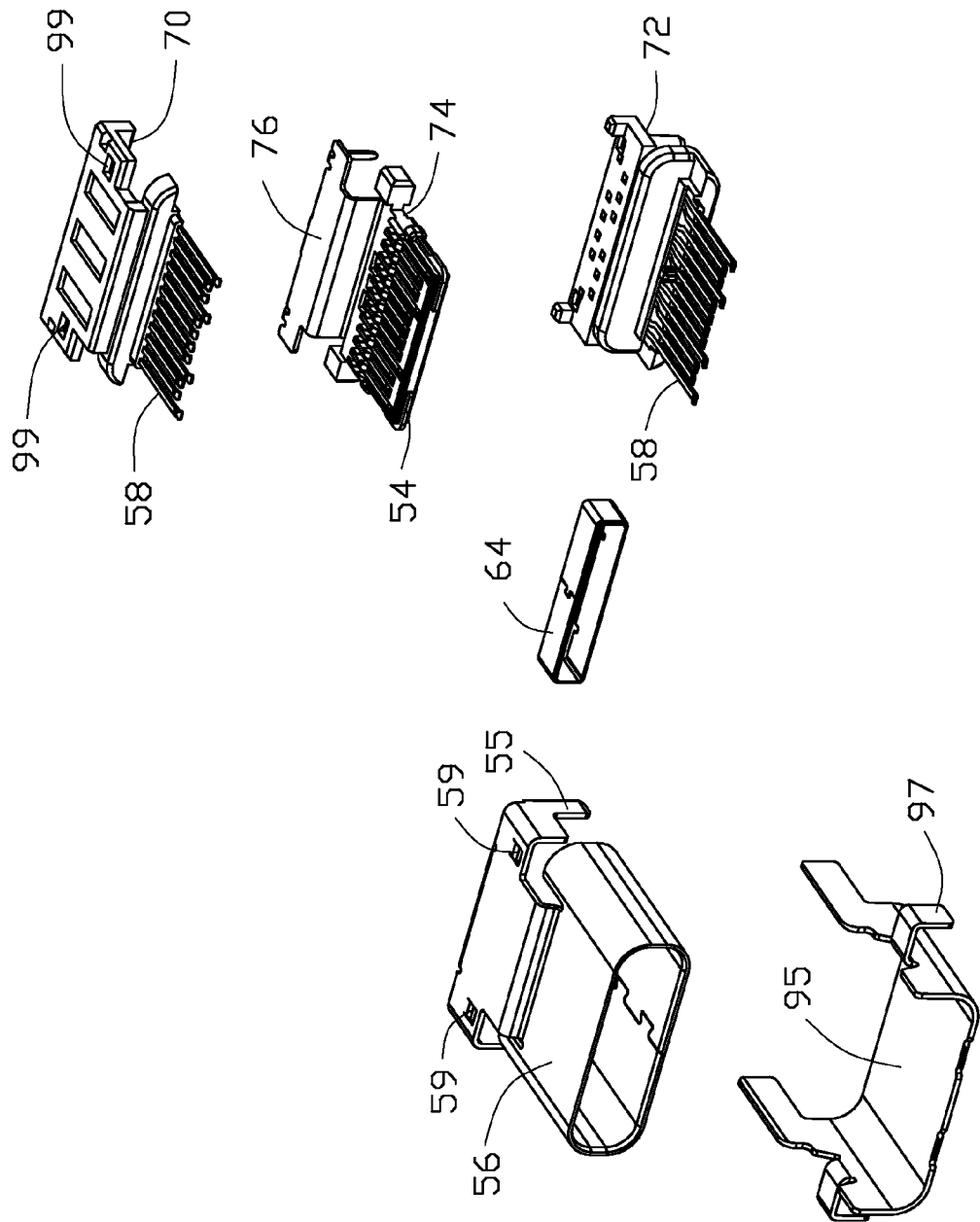
FIG. 8(A) is a front partially exploded perspective view of the receptacle connector of FIG. 1 wherein the housing and the contacts are pre-assembled together.
Figure 8B:
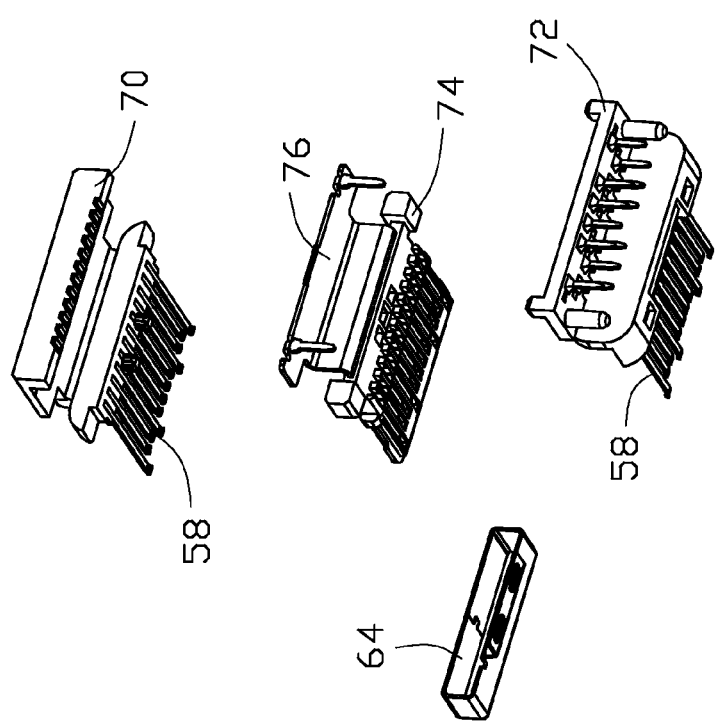
FIG. 8(B) is a rear partially exploded perspective view of the receptacle connector of FIG. 1 wherein the housing and the contacts are pre-assembled together.
Figure 8B:
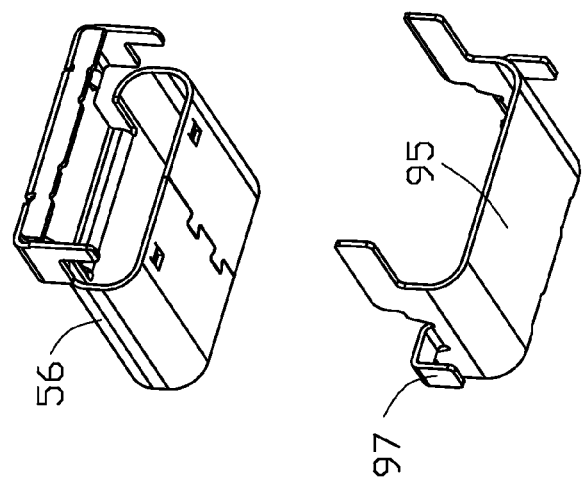
Figure 9:
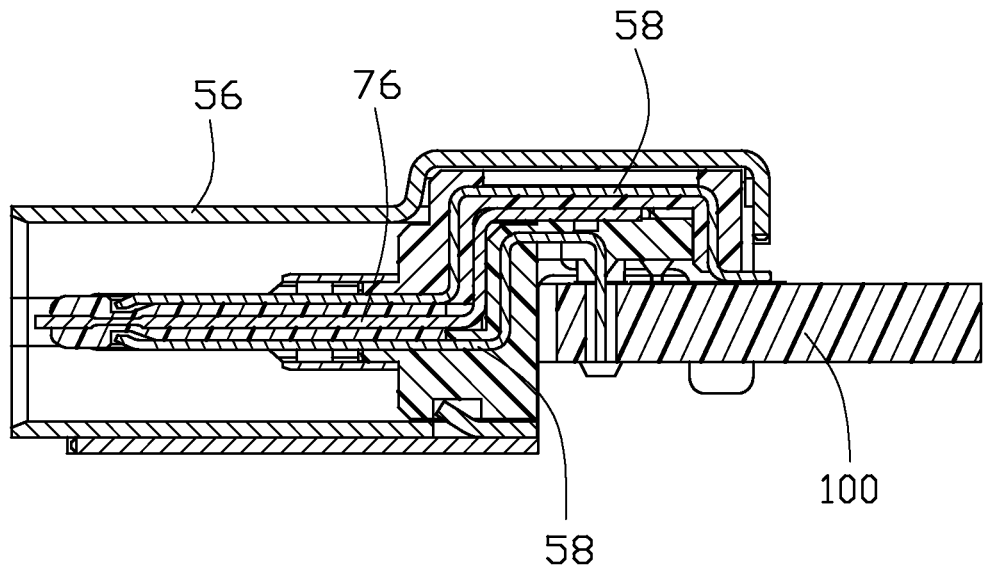
FIG. 9 is a cross-sectional view of the receptacle connector taken along lines 9-9 of FIG. 4 on the printed circuit board.
Figure 10:
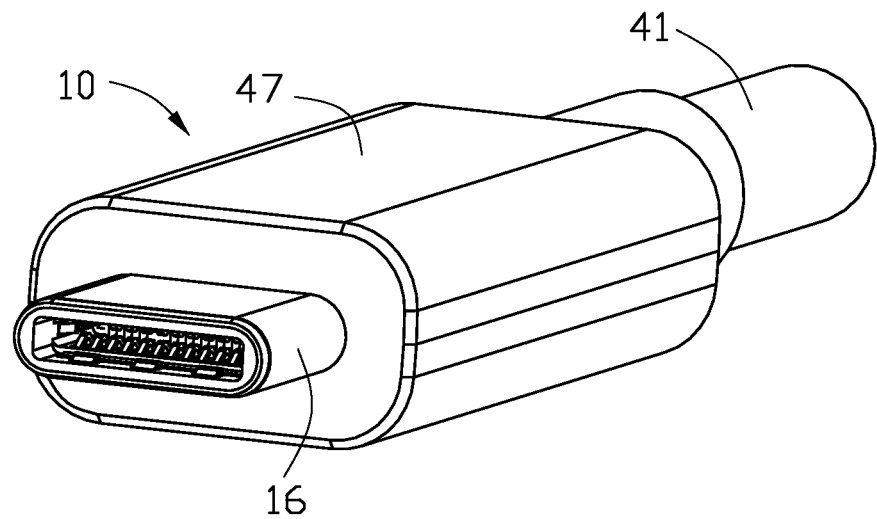
FIG. 10 is a front assembled perspective view of the plug connector of FIG. 1.
Figure 11A:
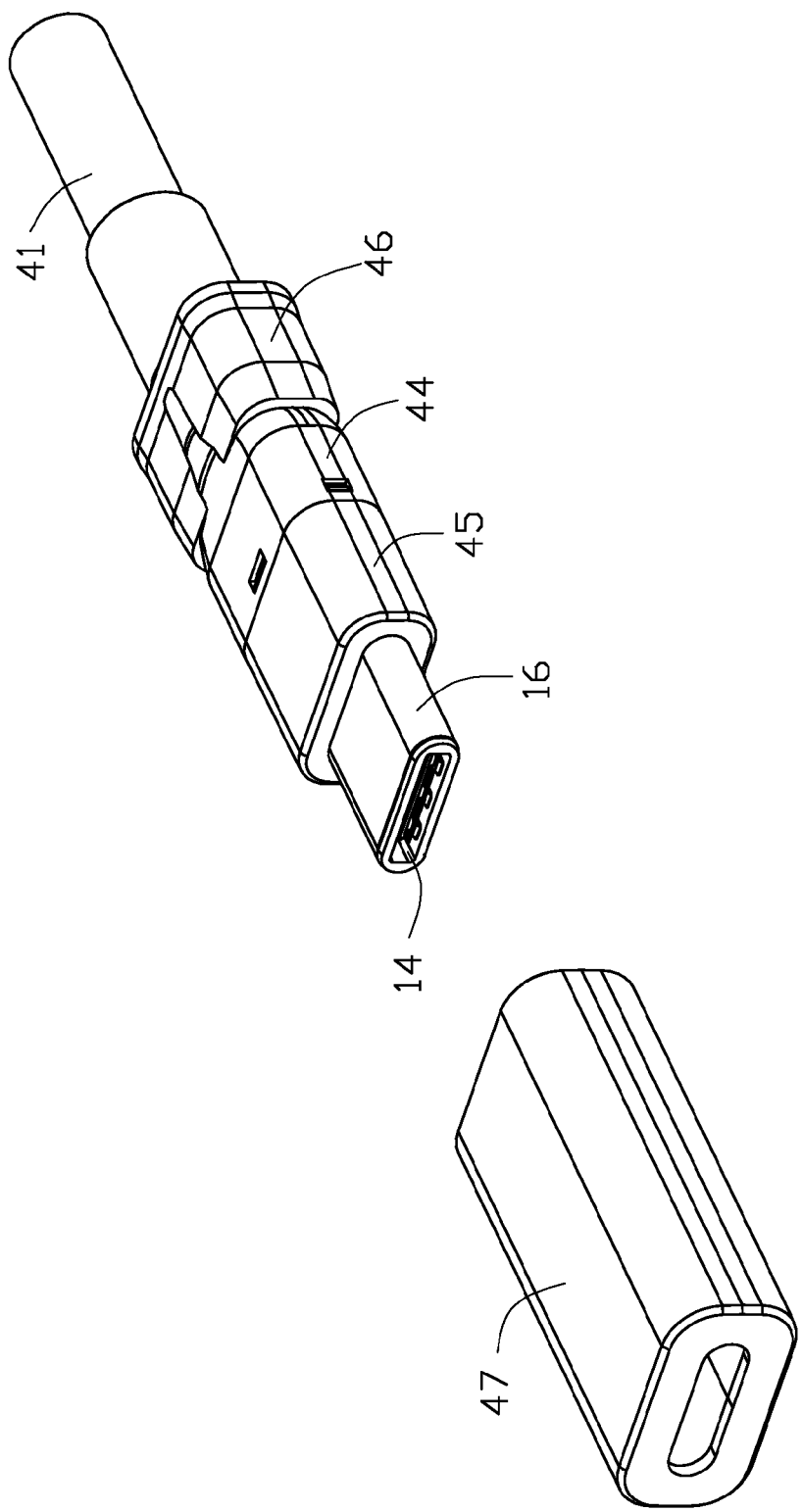
FIG. 11(A) is a front partially exploded perspective view of the plug connector of FIG. 10 wherein the cover is removed away from the remainder.
Figure 11B:
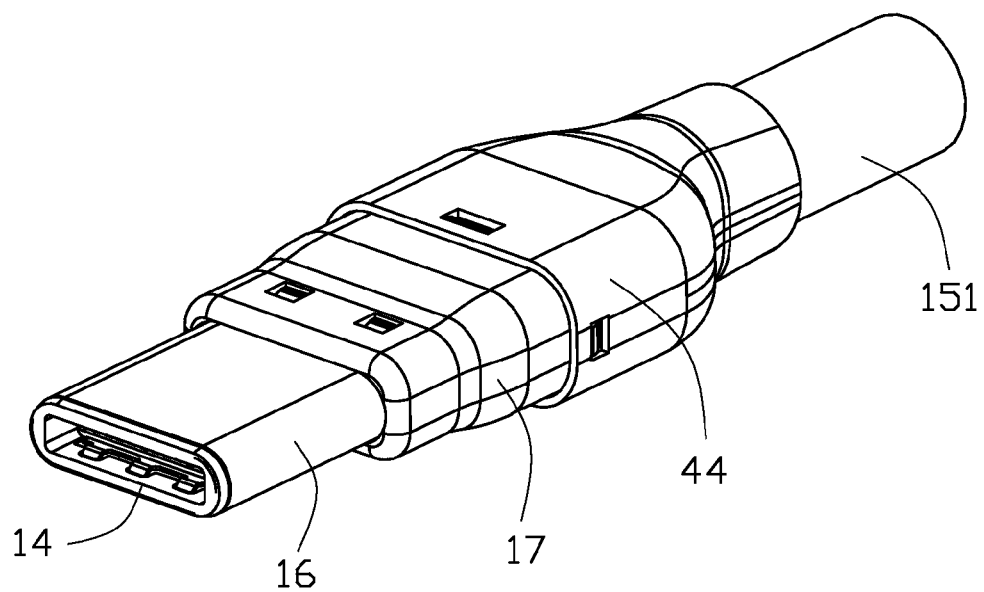
FIG. 11(B) is a front partially exploded perspective view of the plug connector of FIG. 11(A) wherein the front and rear over-moldings have been further removed.
Figure 12A:
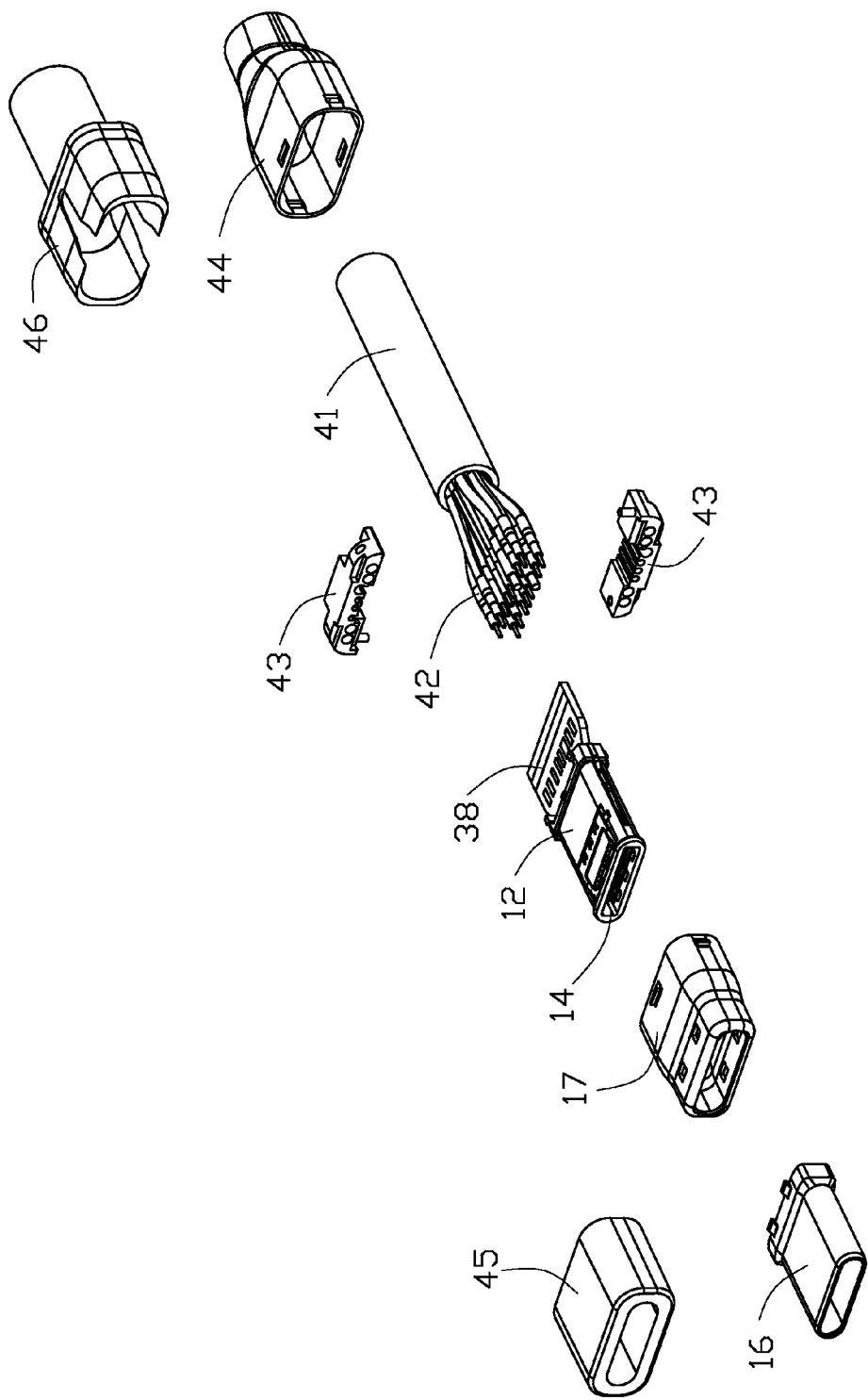
FIG. 12(A) is a front partially exploded perspective view of the plug connector of FIG. 10 without the cover thereof.
Figure 12B:
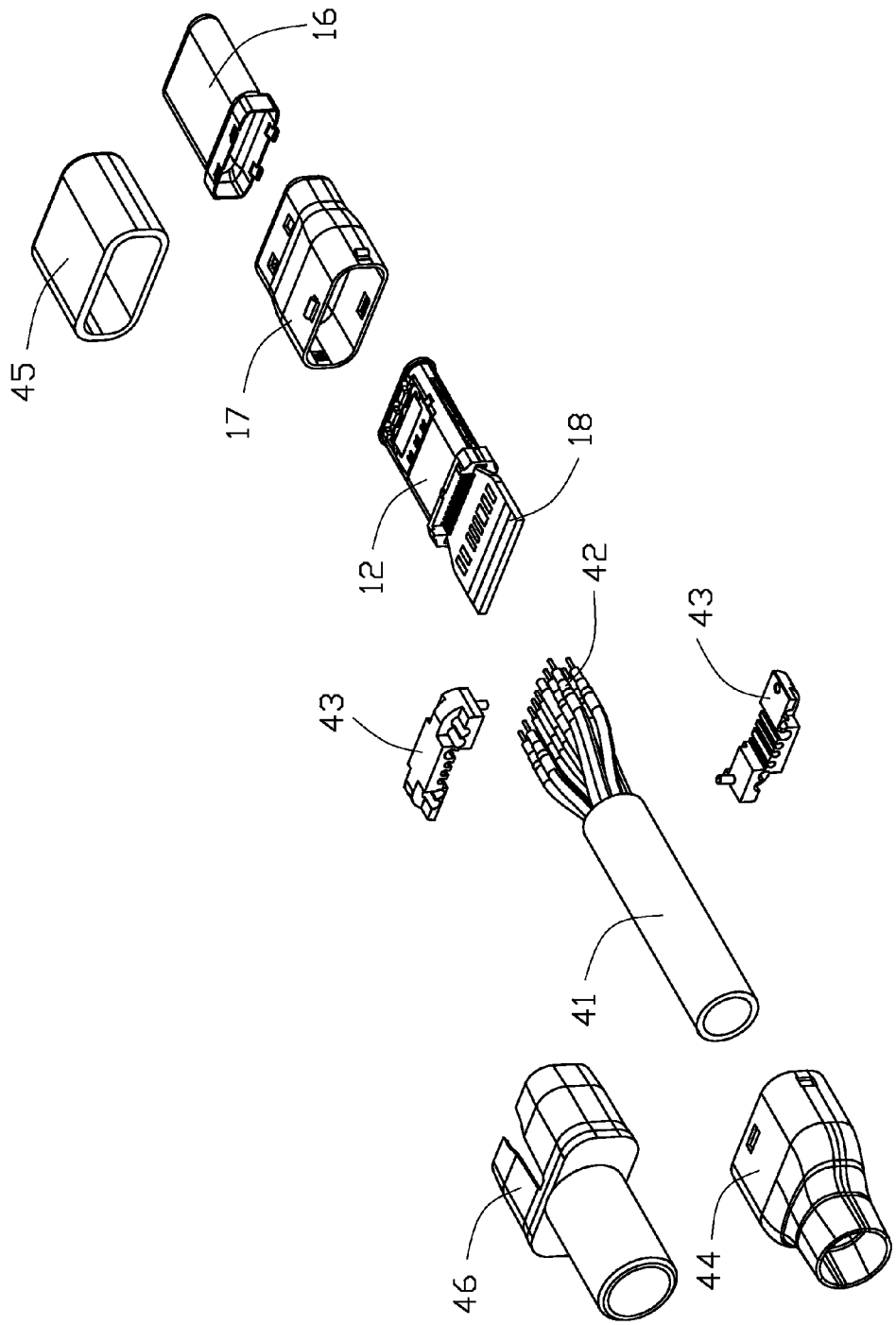
FIG. 12(B) is a rear partially exploded perspective view of the plug connector of FIG. 12(A).
Figure 13A:
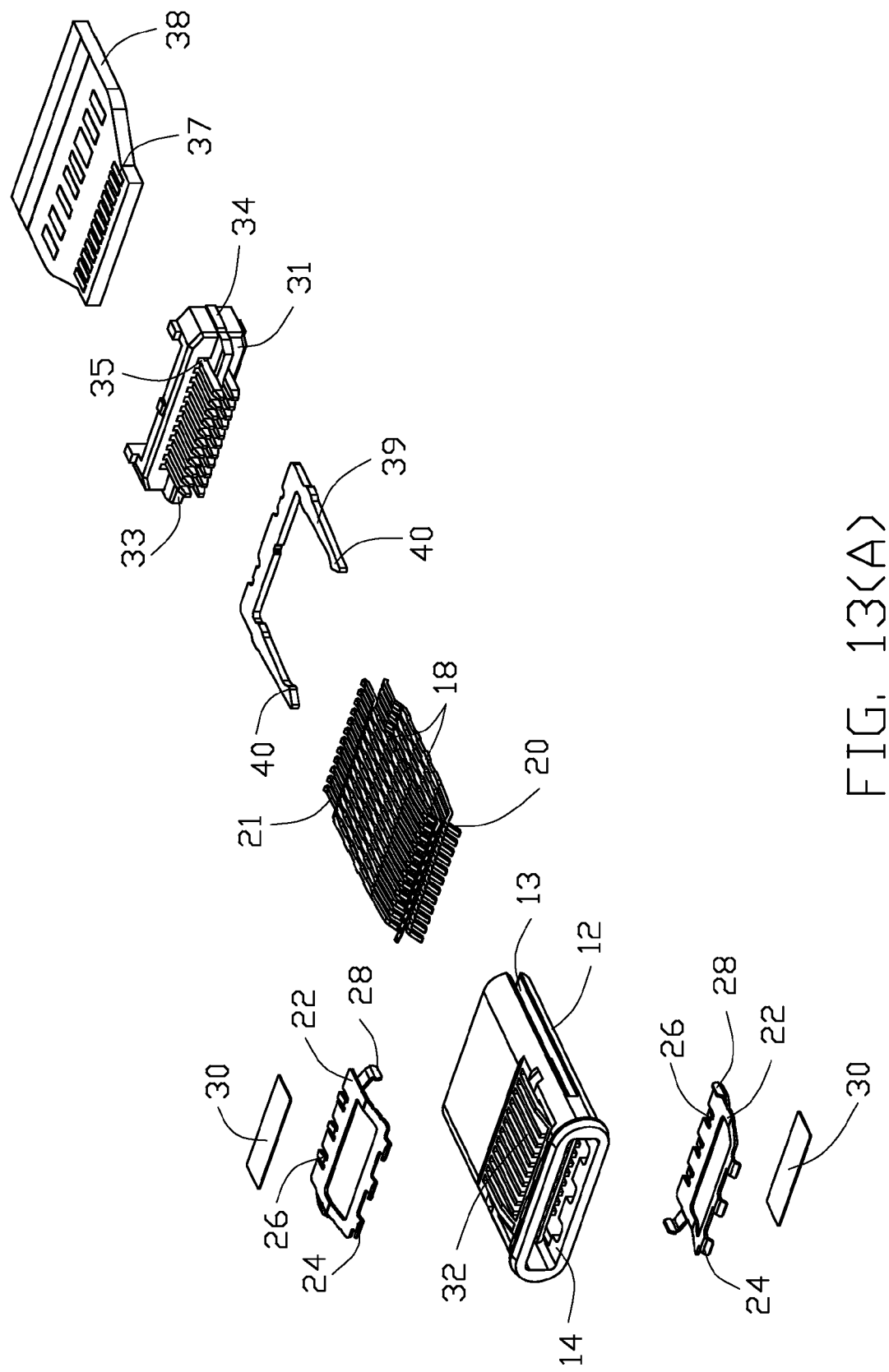
FIG. 13(A) is a front partially exploded perspective view of the plug connector of FIG. 12(A) by removal of additional parts therefrom.
Figure 13B:
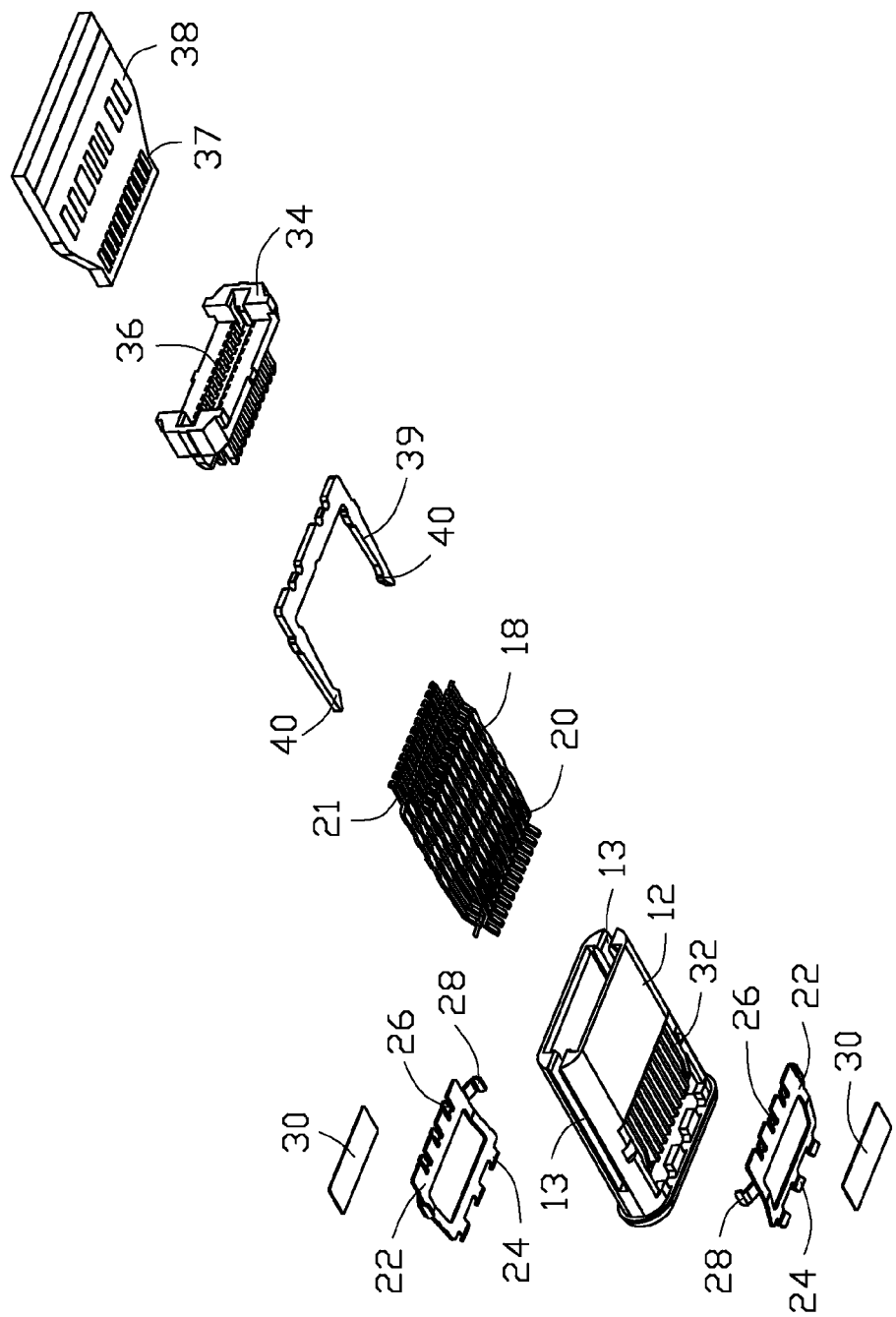
FIG. 13(B) is a rear partially exploded perspective view of the plug connector of FIG. 13(A).
Figure 25:
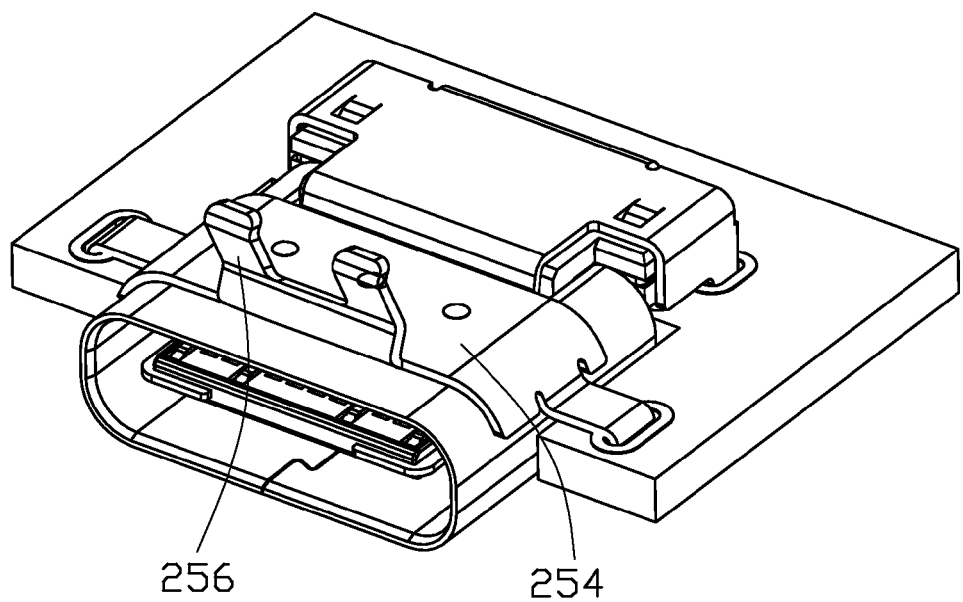
FIG. 25 is an assembled perspective view of the receptacle connector mounted upon the printed circuit board of another embodiment according to the invention.
Figure 25A:
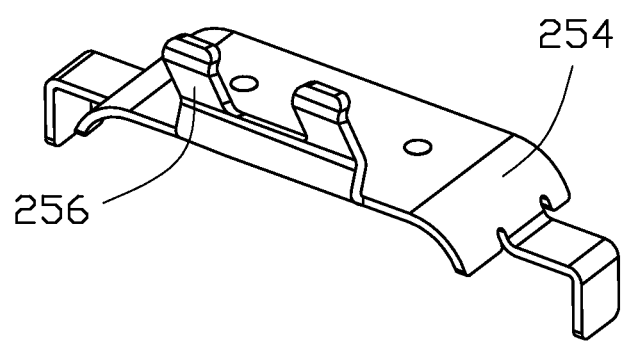
FIG. 25(A) is a perspective view of the bracket of the receptacle connector of FIG. 25.
Figure 25B:
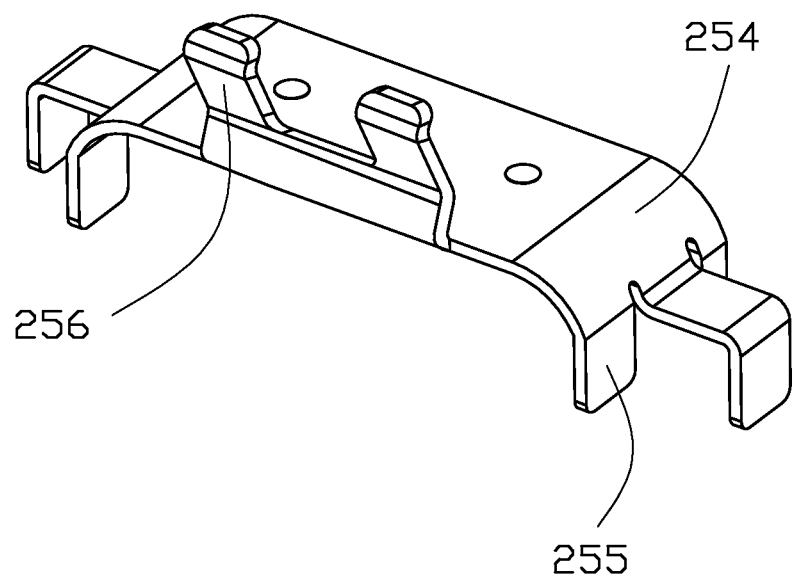
FIG. 25(B) is a perspective view of the modified bracket of the receptacle connector or FIG. 25.
Figure 26:
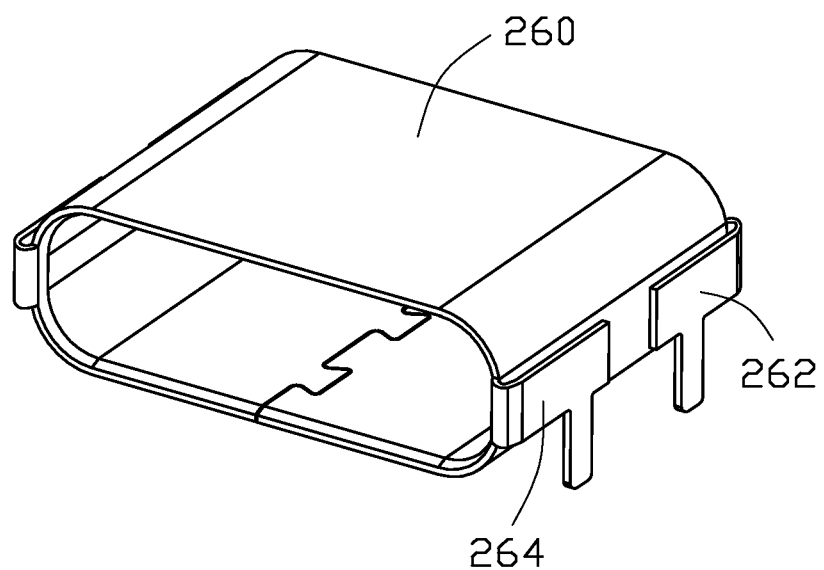
FIG. 26 is a perspective view of the shield of the receptacle connector for mounting upon the printed circuit board of another embodiment according to the invention.
Figure 27:
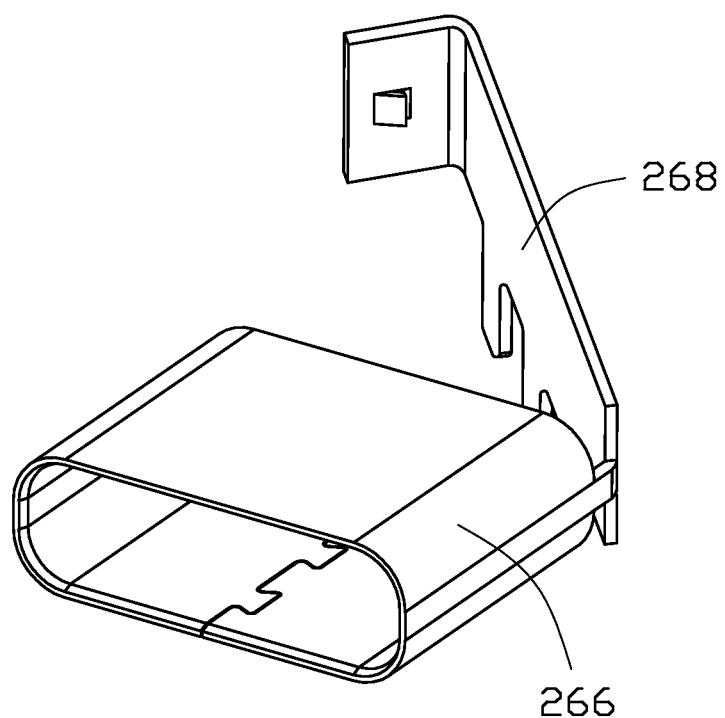
FIG. 27 is a perspective view of the shield of the receptacle connector for mounting upon the printed circuit board of another embodiment according to the invention.
Figure 28:
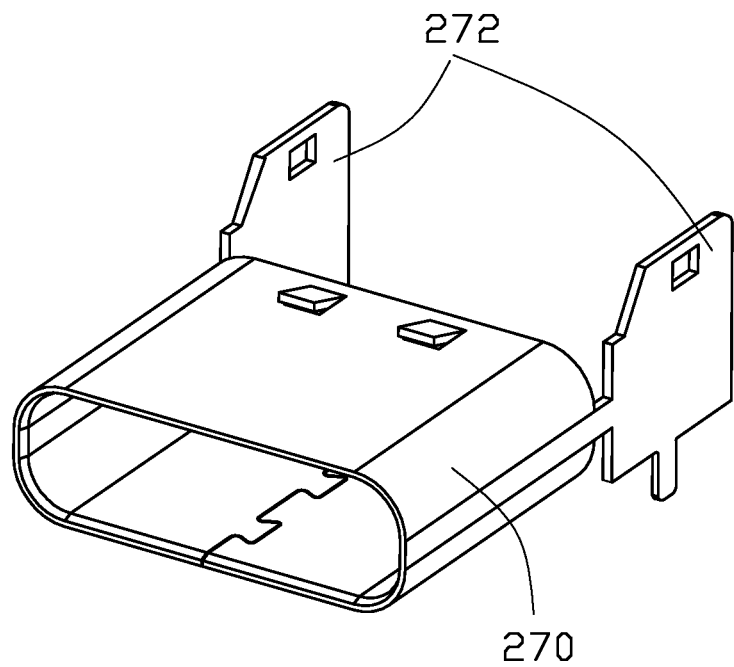
FIG. 28 is a perspective view of the shield of the receptacle connector for mounting upon the printed circuit board of another embodiment according to the invention.
Figure 29:
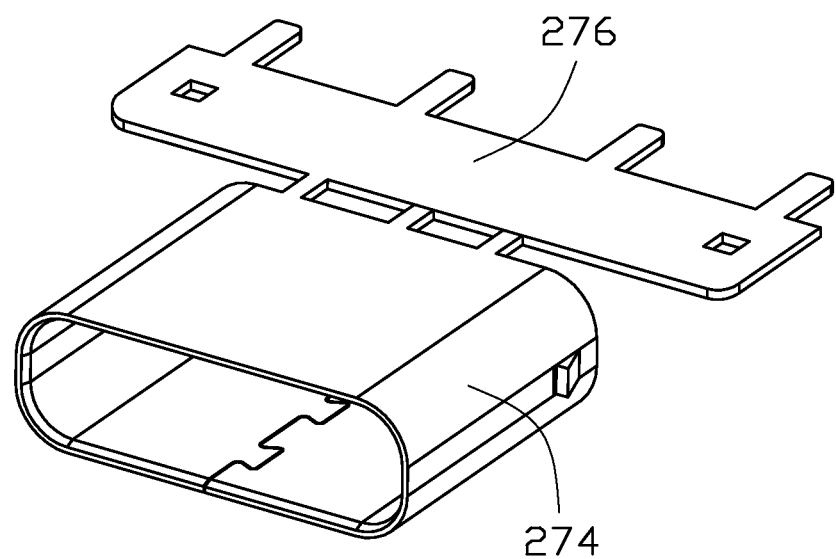
FIG. 29 is a perspective view of the shield of the receptacle connector for mounting upon the printed circuit board of another embodiment according to the invention wherein the rear wall of the shell is shown in an extended manner.
Figure 29A:
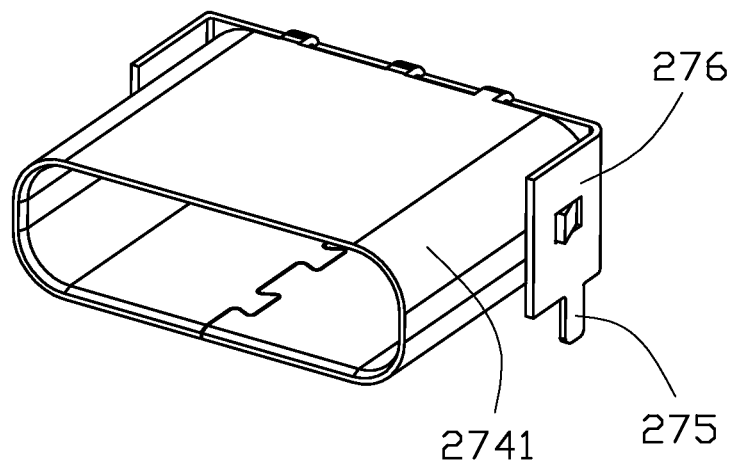
FIG. 29(A) is a perspective view of the shield of the receptacle connector of FIG. 29 wherein the rear wall of the shield is fastened to the side wall of the shield.
Figure 30:
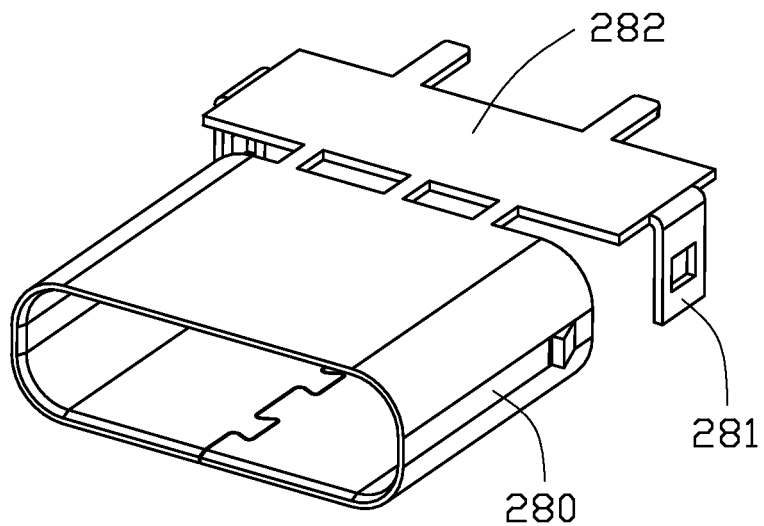
FIG. 30 is a perspective view of the shield of the receptacle connector for mounting upon the printed circuit board of another embodiment according to the invention.
Figure 31A:
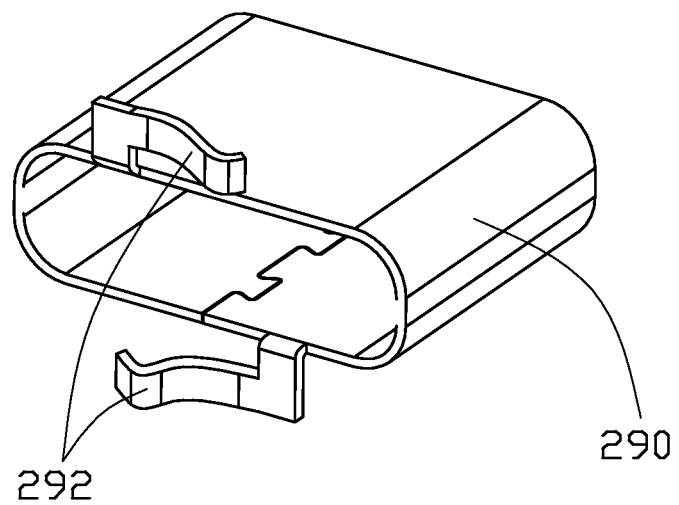
FIG. 31(A) is an perspective view of the shield of the receptacle connector for mounting upon the printed circuit board of another embodiment according to the invention.
Figure 31B:
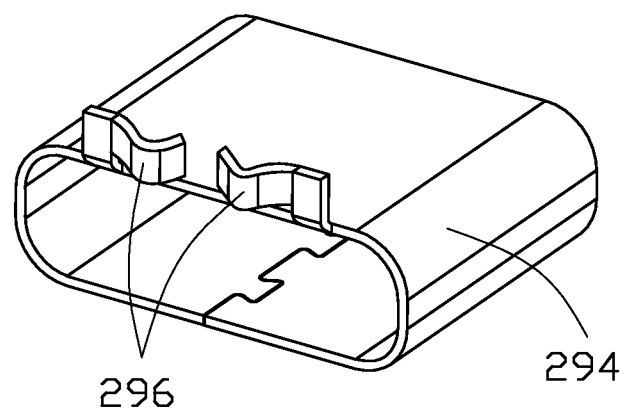
FIG. 31(B) is a perspective view of the shield of the receptacle connector for mounting upon the printed circuit board of another embodiment according to the invention.
Figure 32:
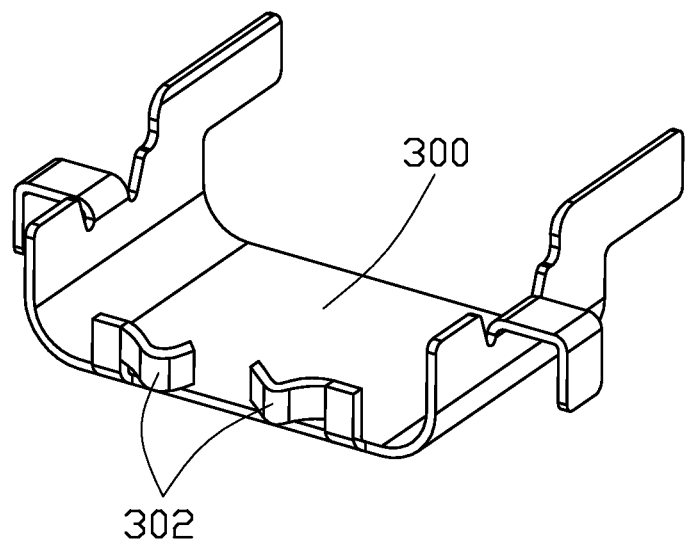
FIG. 32 is a perspective view of the underside bracket of the receptacle connector mounted upon the printed circuit board of another embodiment according to the invention.
Figure 33:
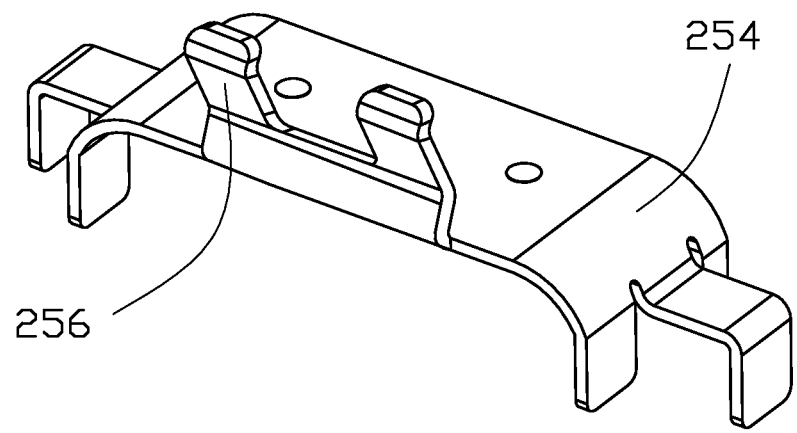
FIG. 33 is a perspective view of the modified bracket of the receptacle connector or FIG. 25.

FIGS. 25-25(A) show the bracket 254 is further equipped with the spring fingers 256 for abutting against the back panel of the computer case. FIG. 25 (B) shows the modified bracket 254 with the curved underside 255 for efficiently holding the shield therewith. FIG. 26 shows the shield 260 only has the front mating port section, further forms the rearwardly folded front leg 264 around the front side edge, and the forwardly folded rear leg 262 around the rear side edge for mounting to the printed circuit board instead of stamping-out type legs which are split from the main face of the shield thus jeopardizing the shielding effect thereof. FIG. 27 shows the rear wall 268 of the shield 266 is connected to a rear edge of the side wall of the shield instead of that of the top wall so as to ease plating process for the mounting legs thereof. FIG. 28 shows the pair of rear walls 272 of the shielding 270 instead of the single one. FIGS. 29-29(A) show the rear wall 276 of the shield 274, the rear walls form two opposite ears to secure to the side walls of the shield wherein the supporting legs 275 of the shield around the rear wall 276 and the sidewalls 2741 are derived from the rear wall. FIG. 30 shows the rear wall 282 of the shield 280 includes two opposite ears 281 secured to the side walls of the shield without providing the mounting legs on the side walls. FIG. 31 (A) shows the shield 290 is equipped with the two spring fingers 292 on the front edges of both the upper and lower sides for abutting against the back panel of the computer case. FIG. 31(B) shows the shield 294 is equipped with a pair of spring fingers 296 on the front edge of the upper side. FIG. 32 shows the underside bracket 300, similar to that in the first embodiment as shown in FIG. 5(A), is equipped with a pair of spring fingers 302 for abutting against the back panel of the computer case.

However, the disclosure is illustrative only, changes may be made in detail, especially in matter of shape, size, and arrangement of parts within the principles of the invention.

What is claimed is:

1. An electrical connector adapted for mounting on a printed circuit board, comprising:
    an insulating housing comprising a rear base and a front mating tongue;
    a plurality of contacts retained in the insulating housing and comprising contacting sections arranged on the mating tongue and mounting tails out of the insulating housing;
    a shielding retained on the insulating housing and comprising a front mating port section thereby defining a mating cavity between the front mating port section and the mating tongue; and
    a metallic bracket attached on the shielding;
    wherein the bracket defines a pair of first supporting legs adjacent to the front mating port section which has no supporting leg split therefrom;
    wherein the shielding defines a rear cover section extending rearwards from the front mating port section, the rear covering section covers on a top of the base of the insulating housing;
    wherein the rear cover section defines a pair of sidewalls bending downwards and a second supporting legs extending downwards from each sidewall;
    wherein the metallic bracket includes a lower wall, two sidewalls bending upwards and two extending sections rearwards extending from the sidewalls, the lower wall and sidewalls cover the front mating port section, the extending sections cover the sidewalls of the rear cover section.

2. The electrical connector as claimed in claim 1, wherein the bracket is either softer or stiffer than the shield.

3. The electrical connector as claimed in claim 1, wherein the bracket defines a pair of spring fingers from a front edge thereof.

4. The electrical connector as claimed in claim 1, wherein the mating port section of the shielding defines a pair of spring fingers from a front edge thereof.

5. The electrical connector as claimed in claim 1, wherein the bracket defines a curved underside for efficiently holding the shield therewith.

6. An electrical connector for mounting to a printed circuit board, comprising:
    a terminal module including an insulative housing with opposite upper and lower rows of contacts associated therewith, said housing defining a mating tongue and a rear base, each of said contacts defining a front mating section located upon a mating surface of the mating tongue, and a rear connecting section for mounting to the printed circuit board, and
    a metallic shielding assembly including a capsular front mating port section enclosing and directly facing the mating tongue, and a rear covering section to cover the rear base of the housing; said metallic shielding assembly further including a metallic bracket directly secured to the capsular front mating port section in a vertical direction of the electrical connector;
    wherein said metallic bracket forms a pair of mounting legs for mounting to the printed circuit board while said capsular front mating port section forms no mounting legs split therefrom for mounting to the printed circuit board and no spring fingers split therefrom for engagement with a corresponding plug connector, thus keeping integrity of the capsular front mating port section under EMI shielding consideration;
    wherein the metallic bracket is soldered to the capsular front mating port section.

7. The electrical connector as claimed in claim 6, wherein a metallic shielding plate is formed within the mating tongue, and said shielding plate forms a pair of immovable locking notch structures on two opposite lateral sides of the mating tongue and exposed to an exterior for latching to a pair of latches of a plug connector which is adapted to be mated within the capsular front mating port section.

8. The electrical connector as claimed in claim 7, wherein the shielding plate includes a mounting leg for mounting to the printed circuit board.

9. The electrical connector as claimed in claim 7, wherein the rear covering section is unitarily formed with the bracket and has a mounting leg for mounting to the printed circuit board.

10. The electrical connector as claimed in claim 7, wherein the bracket forms a spring finger extending forwardly, and a tip of said spring finger extends forwardly beyond a front opening of said capsular front mating port section.

11. The electrical connector as claimed in claim 7, wherein said rear covering section includes a top wall, a rear wall downwardly extending from a rear edge of the top wall, and a pair of side walls downwardly extending from two opposite lateral side edge of the top wall.

12. The electrical connector as claimed in claim 7, wherein the rear covering section is unitarily formed with the capsular front mating port section; said metallic bracket includes a lower wall supportably contacting an undersurface of the capsular front mating port section, and a pair of side walls extending upwardly from two opposite lateral sides of the lower wall, and each of said side walls includes a downwardly extending mounting leg for mounting to the printed circuit board.

13. The electrical connector as claimed in claim 7, wherein the rear covering section is unitarily formed with the capsular front mating port section; said metallic bracket includes an upper wall contacting an upper surface of the capsular front mating port section, and a pair of side walls extending downwardly from two opposite lateral sides of the upper wall, and each of said side walls includes a downwardly extending mounting leg for mounting to the printed circuit board.

14. The electrical connector as claimed in claim 7, wherein the housing is constituted by an upper insulator which is associated the upper row of contacts, and a lower insulator which is associated with the lower row of contacts.

15. The electrical connector as claimed in claim 7, wherein said rear covering section is essentially a vertically extending rear wall.

16. The electrical connector as claimed in claim 7, wherein at least either the upper row of contacts or the lower row of contacts are integrally formed with the housing via an insert-molding process.

17. The electrical connector as claimed in claim 7, wherein the rear covering section is higher than the capsular front mating port section in the vertical direction, and is equipped with a rear wall to enclose said rear base of the housing.

18. An electrical connector for mounting to a printed circuit board, comprising:
an insulative housing comprising a rear base and a mating tongue extending forwardly from the rear base;
opposite upper and lower rows of contacts associated with the insulative housing, each of the contacts defining a mating section located upon a mating surface of the mating tongue and a connecting section for mounting to the printed circuit board;
a metallic shielding retained with the rear base and comprising a mating port section surrounding the mating tongue thereby defining a mating cavity between the mating port section and the mating tongue, the mating cavity and the contacts being arranged in a diagonally symmetrical arrangement;
a shielding plate forms a pair of immovable locking notch structures exposed upon two opposite lateral sides of the mating tongue;
wherein the mating port section of the metallic shielding forms no mounting leg and no spring fingers splitting to extend therewith for keeping integrity therewith under EMI consideration;
wherein the mating port section is equipped with a mounting leg for mounting to the printed circuit board, and the mounting leg is not split from the mating port section but extending from one of opposite front and rear edges of the mating port section in a folded manner.

19. The electrical connector as claimed in claim 18, wherein the metallic shielding is equipped with a rear wall, the rear wall is connected to a rear edge of a side wall of the metallic shielding so as to ease plating process for the mounting legs thereof.

20. The electrical connector as claimed in claim 18, wherein the metallic shielding is equipped with a pair of rear walls, the rear walls are connected to corresponding rear edges of side walls of the metallic shielding.

* * * * *